United States Patent
Peczalski et al.

(10) Patent No.: US 9,989,563 B2
(45) Date of Patent: Jun. 5, 2018

(54) DISTURBANCE REJECTION FOR CURRENT-MEASUREMENT SYSTEMS

(71) Applicant: Honeywell International Inc., Morris Plains, NJ (US)

(72) Inventors: Andy Peczalski, Edina, MN (US); Tom Rezachek, Cottage Grove, MN (US); Fouad Nusseibeh, Champlin, MN (US)

(73) Assignee: Honeywell International Inc., Morris Plains, NJ (US)

( * ) Notice: Subject to any disclaimer, the term of this patent is extended or adjusted under 35 U.S.C. 154(b) by 0 days. days.

(21) Appl. No.: 14/915,050

(22) PCT Filed: Mar. 26, 2014

(86) PCT No.: PCT/US2014/031792
§ 371 (c)(1),
(2) Date: Feb. 26, 2016

(87) PCT Pub. No.: WO2015/030871
PCT Pub. Date: Mar. 5, 2015

(65) Prior Publication Data
US 2016/0223699 A1 Aug. 4, 2016

Related U.S. Application Data

(60) Provisional application No. 61/872,351, filed on Aug. 30, 2013, provisional application No. 61/876,104, filed on Sep. 10, 2013.

(51) Int. Cl.
*G01R 15/20* (2006.01)
*G01R 19/165* (2006.01)
(Continued)

(52) U.S. Cl.
CPC ......... *G01R 15/205* (2013.01); *G01R 15/207* (2013.01); *G01R 19/0053* (2013.01);
(Continued)

(58) Field of Classification Search
CPC combination set(s) only.
See application file for complete search history.

(56) References Cited

U.S. PATENT DOCUMENTS

| 5,433,110 A | 7/1995 | Gertz et al. |
| 6,169,254 B1 | 1/2001 | Pant et al. |

(Continued)

FOREIGN PATENT DOCUMENTS

| CN | 102265167 A | 11/2011 |
| CN | 102694140 B | 2/2015 |

(Continued)

OTHER PUBLICATIONS

International Search Report, PCT/US2014/031792, Aug. 19, 2014, 2 pages.
(Continued)

*Primary Examiner* — Clayton E Laballe
*Assistant Examiner* — Jas Sanghera
(74) *Attorney, Agent, or Firm* — Craig Thompson; Thompson Patent Law

(57) ABSTRACT

Apparatus and associated methods relate to an in-hole current-measurement system having three or more magnetic-field sensors and a transient-disturbance selection module configured to form an output signal from a selected subset of sensor signals while decoupling the output signals from a non-selected subset of sensor signals during a predetermined time window when a disturbance signal is expected at the non-selected set of sensor signals. In an illustrative example, a disturbance producing operation may be performed on alternating subsets of sensors while the undisturbed subset of sensors measures an electrical current in the electrical conductor. For example, each selected subset of sensors may be aligned on an axis configured to be mounted perpendicular to current flow within a hole in the
(Continued)

electrical conductor. Some embodiments may advantageously provide continuous electrical current measurement while being uninterrupted by the predetermined transient disturbances.

17 Claims, 16 Drawing Sheets

(51) Int. Cl.
| | |
|---|---|
| G01R 33/09 | (2006.01) |
| G01R 19/00 | (2006.01) |
| G01R 33/00 | (2006.01) |
| G01V 3/02 | (2006.01) |
| H02H 1/00 | (2006.01) |
| H02H 3/08 | (2006.01) |

(52) U.S. Cl.
CPC ... *G01R 19/16547* (2013.01); *G01R 33/0023* (2013.01); *G01R 33/096* (2013.01); *G01V 3/02* (2013.01); *H02H 1/0007* (2013.01); *H02H 3/08* (2013.01)

(56) References Cited

U.S. PATENT DOCUMENTS

| | | | |
|---|---|---|---|
| 6,271,656 B1 * | 8/2001 | Juds | G01R 15/20 324/117 H |
| 6,429,661 B1 | 8/2002 | Schweitzer, Jr. | |
| 6,504,366 B2 | 1/2003 | Bodin et al. | |
| 6,949,921 B1 | 9/2005 | Feight et al. | |
| 7,057,485 B2 | 6/2006 | Preusse et al. | |
| 7,095,226 B2 | 8/2006 | Wan et al. | |
| D545,304 S | 6/2007 | Sergi | |
| 7,230,436 B2 | 6/2007 | Terada et al. | |
| 7,755,347 B1 | 7/2010 | Cullen et al. | |
| 7,796,028 B1 | 9/2010 | Kotter et al. | |
| 8,003,894 B2 | 8/2011 | Fazakas | |
| 8,459,112 B2 | 6/2013 | Rieger et al. | |
| 8,558,535 B2 | 10/2013 | Sorensen | |
| 8,580,427 B2 | 11/2013 | Oya | |
| 9,450,391 B2 | 9/2016 | Peczalski | |
| 9,488,699 B2 | 11/2016 | Peczalski | |
| 2003/0057938 A1 | 3/2003 | Goetz | |
| 2005/0017714 A1 | 1/2005 | Beichler et al. | |
| 2005/0052264 A1 | 3/2005 | Kokubu et al. | |
| 2005/0073293 A1 | 4/2005 | Hastings et al. | |
| 2005/0156587 A1 | 7/2005 | Yakymyshyn et al. | |
| 2006/0018643 A1 | 1/2006 | Stavely et al. | |
| 2006/0061365 A1 * | 3/2006 | Lee | G01R 31/025 324/426 |
| 2008/0169817 A1 | 7/2008 | Morrison et al. | |
| 2009/0251308 A1 | 10/2009 | Schweitzer, III et al. | |
| 2010/0026286 A1 | 2/2010 | Koss et al. | |
| 2010/0156394 A1 | 6/2010 | Ausserlechner et al. | |
| 2010/0231198 A1 | 9/2010 | Bose et al. | |
| 2011/0057650 A1 | 3/2011 | Hellwig et al. | |
| 2011/0074382 A1 | 3/2011 | Patel | |
| 2011/0270553 A1 | 11/2011 | Ausserlechner et al. | |
| 2012/0032674 A1 | 2/2012 | Rajula et al. | |
| 2012/0146164 A1 | 6/2012 | Ausserlechner | |
| 2012/0158324 A1 | 6/2012 | Romani et al. | |
| 2012/0166122 A1 * | 6/2012 | Bottinelli | G01R 33/09 702/85 |
| 2012/0326713 A1 | 12/2012 | Zimmer et al. | |
| 2013/0149919 A1 | 6/2013 | Lee et al. | |
| 2014/0218018 A1 * | 8/2014 | Ivanov | G01R 33/02 324/247 |
| 2016/0356822 A1 | 12/2016 | Peczalski et al. | |

FOREIGN PATENT DOCUMENTS

| | | |
|---|---|---|
| CN | 104851476 A | 8/2015 |
| CN | 105980864 A | 9/2016 |
| CN | 206505114 U | 9/2017 |
| DE | 10054016 A1 | 5/2002 |
| DE | 10243645 A1 | 6/2004 |
| DE | 102012102270 A1 | 9/2012 |
| EP | 2060923 A2 | 5/2009 |
| EP | 2908143 A1 | 8/2015 |
| EP | 3039434 A1 | 7/2016 |
| EP | 3039435 A1 | 7/2016 |
| JP | 320611 U | 8/2016 |
| JP | 3206211 U | 9/2016 |
| JP | 3208924 U | 2/2017 |
| WO | 0167117 A2 | 9/2001 |
| WO | 2009135878 A1 | 11/2009 |
| WO | 2013063773 | 5/2013 |
| WO | 2013063773 A1 | 5/2013 |
| WO | 2015030871 A1 | 3/2015 |
| WO | 2015030872 A1 | 3/2015 |

OTHER PUBLICATIONS

Supplementary European Search Report, EP Application No. 14840010, dated Jul. 12, 2016, 10 pages.
Supplementary European Search Report, EP Application No. 14840683, dated Jun. 12, 2016, 10 pages.
Chinese Patent Office Action, Chinese. Application No. 201490001141.9, Jan. 18, 2017; 3 pages.
International Search Report, PCT/US2014/031807, Aug. 12, 2014, 3 pages.
Supplementary European Search Report, EP Application No. 14840010, dated Dec. 7, 2016, 10 pages.
A Low-Cost Multiple Hall Probe Current Transducer, Scoville et al.; Review of Scientific Instruments' 62 (1991) March, No. 3, New York, US.
International Search Report, PCT/US2014/031807, dated Aug. 12, 2014, 3 pages.
Extended European Search Report, EP Application No. 15153650.5, dated Jul. 7, 2015, 8 pages.
Supplementary European Search Report, EP Application No. 14840010.4, dated Dec. 7, 2016, 10 pages.
A Low-Cost Multiple Hall Probe Current Transducer, Scoville et al.; Review of Scientific Instruments' 62 (1991) March, No.3, New York, US.
Supplementary European Search Report, EP Application No. 14840683, dated Dec. 6, 2016, 10 pages.
China Utility Model Application No. 201490001141.9, Office Action, dated Dec. 7, 2016, 2 pages.
U.S. Appl. No. 14/599,851, Office Action, dated Apr. 20, 2016, 18 pages.
U.S. Appl. No. 14/599,851, Notice of Allowance, dated May 27, 2016, 8 pages.
Japan Utility Model Application No. 2016-600079, Notice of Amendment, dated Aug. 3, 2016, 4 pages.
China Utility Model Application No. 201490001141.9, Notice of Amendment, dated Aug. 11, 2016, 2 pages.
China Utility Model Application No. 201490001141.9, Office Action, dated Mar. 22, 2017, 2 pages.
China Utility Model Application No. 201490001139.1, Notice of Amendment, dated Aug. 2, 2016, 2 pages.
China Utility Model Application No. 201490001139.1, Notice of Amendment, dated Nov. 15, 2016, 1 page.
China Utility Model Application No. 201490001139.1, Notice of Amendment, dated Mar. 8, 2017, 1 page.
U.S. Appl. No. 13/457,014, Office Action, dated Dec. 3, 2013, 15 pages.
U.S. Appl. No. 13/457,014, Final Office Action, dated Mar. 21, 2014, 15 pages.
U.S. Appl. No. 13/457,014, Office Action, dated Aug. 12, 2014, 17 pages.
U.S. Appl. No. 13/457,014, Final Office Action, dated Feb. 12, 2015, 20 pages.
U.S. Appl. No. 13/457,014, Office Action, dated Jun. 3, 2015, 22 pages.

(56) References Cited

OTHER PUBLICATIONS

U.S. Appl. No. 13/457,014, Final Office Action, dated Sep. 25, 2015, 24 pages.
U.S. Appl. No. 13/457,014, Advisory Action, dated Nov. 27, 2015, 5 pages.
U.S. Appl. No. 13/457,014, Pre-Appeal Conference Decision, dated Jan. 22, 2016, 2 pages.
U.S. Appl. No. 13/457,014, Office Action, dated Apr. 20, 2016, 19 pages.
U.S. Appl. No. 13/457,014, Notice of Allowance, dated Jun. 21, 2016, 10 pages.
China Utility Model Application No. 201490001141.9, Notice to Grant Patent Right, dated Jul. 6, 2017, 4 pages.
China Utility Model Application No. 201490001139.1, Notice to Grant Patent Right, dated Jun. 9, 2017, 4 pages.
International Search Report, PCT/US2014/031792, dated Aug. 19, 2014, 3 pages.
Written Opinion of the International Search Authority, PCT/US2014/031792, dated Aug. 19, 2014, 5 pages.
International Preliminary Report on Patentability, PCT/US2014/031792, dated Mar. 10, 2016, 7 pages.
Europe Patent Application No. 15153650.5, Communication Pursuant to Rules 70(2) and 70a(2) and reference to 39(1) EPC, dated Aug. 24, 2015, 2 pages.
China Patent Application No. 201510083698.2, Office Action, dated Jun. 2, 2017, 12 pages.
Written Opinion of the International Search Authority, PCT/US2014/031807, dated Aug. 12, 2014, 5 pages.
International Preliminary Report on Patentability, PCT/US2014/031807, dated Mar. 1, 2016, 6 pages.
China Utility Model Patent Application No. 20140001141.9, entitled Disturbance Rejection for Current-Measurement Systems, filed Mar. 24, 2014, 89 pages.
China Patent No. ZL20140001141.9, Certificate of Patent for Utility Model, dated Oct. 13, 2017, 2 pages.

\* cited by examiner

The Positions of sensor is centered in all 3 axis to obtain the lowest sensor reading
Visual verification of the central location with mirror
The horizontal axis adjustment with about 80μm
11 data point taken for each position for current 0-20A

DISTURBANCE REJECTION FOR CURRENT-MEASUREMENT SYSTEMS

CROSS-REFERENCE TO RELATED APPLICATIONS

This application claims priority as the National Stage of International Application No. PCT/US2014/031792 filed on Mar. 26, 2014 and entitled DISTURBANCE REJECTION FOR CURRENT-MEASUREMENT SYSTEMS, which claims priority to: 1) U.S. Provisional Patent Application Ser. No. 61/872,351 entitled ACCURACY IMPROVEMENT FOR CURRENT SENSOR IMBEDDED IN THE CONDUCTOR, and filed Aug. 30, 2013, and 2) U.S. Provisional Patent Application Ser. No. 61/876,104 entitled CURRENT SENSOR IMBEDDED IN METAL CONDUCTOR, and filed Sep. 10, 2013, all three of which are incorporated herein by reference in their entirety.

TECHNICAL FIELD

Various embodiments relate generally to current measured continuously throughout a scheduled disturbance event.

BACKGROUND

Current sensors are widely used to determine the consumption of electricity and controlling devices operated with electrical current. Current sensors are also used for scientific analyses and experiments. Measuring large currents can be done by measuring the magnetic field surrounding a conductor. But these high-current sensors can be large. Often these large current sensing devices surround the conductor with a magnetic core. A step-down transformer may be used to attenuate the large signal that high-currents produce. These step-down transformers may also be used to generate an opposing magnetic field to permit the use of low-field sensors. These step-down transformers can be expensive large and heavy. Adjacent electrical conductors sometimes carry large currents as well. These adjacent current carrying conductors also generate magnetic fields which can interfere with the measurement. The magnetic cores and step-down transformers increase the size, weight, and cost of current measurement systems.

SUMMARY

Apparatus and associated methods relate to an in-hole current-measurement system having three or more magnetic-field sensors and a transient-disturbance selection module configured to form an output signal from a selected subset of sensor signals while decoupling the output signals from a non-selected subset of sensor signals during a predetermined time window when a disturbance signal is expected at the non-selected set of sensor signals. In an illustrative example, a disturbance producing operation may be performed on alternating subsets of sensors while the undisturbed subset of sensors measures an electrical current in the electrical conductor. For example, each selected subset of sensors may be aligned on an axis configured to be mounted perpendicular to current flow within a hole in the electrical conductor. Some embodiments may advantageously provide continuous electrical current measurement while being uninterrupted by the predetermined transient disturbances.

Some embodiments may calculate a current in a conductor based on an odd-order spatial derivative function of signals representing magnetic-field strengths within a hole in the conductor. In an illustrative embodiment, the odd-order spatial derivative function may generate an output signal representing a spatial derivative of the in-hole magnetic field greater than the first-order. The three or more magnetic-field sensors may be configured to align on the hole's axis when inserted into the hole. When inserted into the hole, the sensors may be aligned on an axis perpendicular to a direction of current flow and be responsive to a magnetic-field directed perpendicular to both the direction of current flow and the aligned axis. Some embodiments may advantageously provide a precise measurement indicative an electrical current in the electrical conductor while substantially rejecting a stray magnetic field originating from an adjacent electrical conductor. Some embodiments may be substantially position-insensitive for measuring high-currents in a conductor. Various embodiments may have two or more magnetic field sensing devices located approximately in the center of a hole located in a conductor. Each of the magnetic field sensing devices may measure the magnetic field along a specific direction at a location within the hole. Near the center of the hole, the magnetic field resulting from current carried by the conductor may be small in the measured direction. The small magnetic fields at the sensor locations may permit the use of high-precision sensors. In some embodiments, the measurement differences between pairs of the two or more sensing devices may be used to determine a current carried by the conductor. The measurement differences may be substantially insensitive to stray magnetic fields.

Various embodiments may achieve one or more advantages. For example, some embodiments may permit the use of very sensitive current sensors. Some embodiments may include an array of Anisotropic Magnetoresistive sensors, for example. Such sensing devices may be manufactured on a single silicon die. This small die may be relatively inexpensive. A small device may permit adjacent bus bars to be located in close proximity one to another. A small device may facilitate installation and maintenance. Small measurement devices may permit the measurement of many different sizes and types of conductors. Measurement accuracy may be improved by permitting high-precision devices to be used. Measurement accuracy may be improved by the rejection of stray magnetic fields. A single unipolar supply voltage may be used in some embodiments. Various embodiments may be realized using low power. Low-cost solutions using various embodiments may be realized. The precision requirement for locating the sensor may be substantially relieved because of the relative position insensitivity of the sensor array. If more sensors are in the array than are needed, such redundancy may permit accurate measurements even after an individual sensor fails.

The details of various embodiments are set forth in the accompanying drawings and the description below. Other features and advantages will be apparent from the description and drawings, and from the claims.

BRIEF DESCRIPTION OF THE DRAWINGS

Like reference symbols in the various drawings indicate like elements.

DETAILED DESCRIPTION OF ILLUSTRATIVE EMBODIMENTS

To aid understanding, this document is organized as follows. First, the technique for using in-hole magnetic-field sensors to measure electrical current in an electrical conductor will be described, with reference to FIGS. 1-6. Then the rejection of stray magnetic fields by use of in-hole magnetic-field sensors will be described with reference to FIGS. 7-10. Then exemplary embodiments of in-hole current-measurement systems will be described with reference to FIGS. 11-12. The ability to make continuous current measurements while performing transient-disturbance operations on a subset of the magnetic field sensors will be described with reference to FIGS. 13-16. Finally, precise current measurements are facilitated by precisely locating the magnetic-field sensors on a single semiconductor substrate. Exemplary embodiments of a single IC implementation will be described with reference to FIGS. 17-19.

Figure 1:
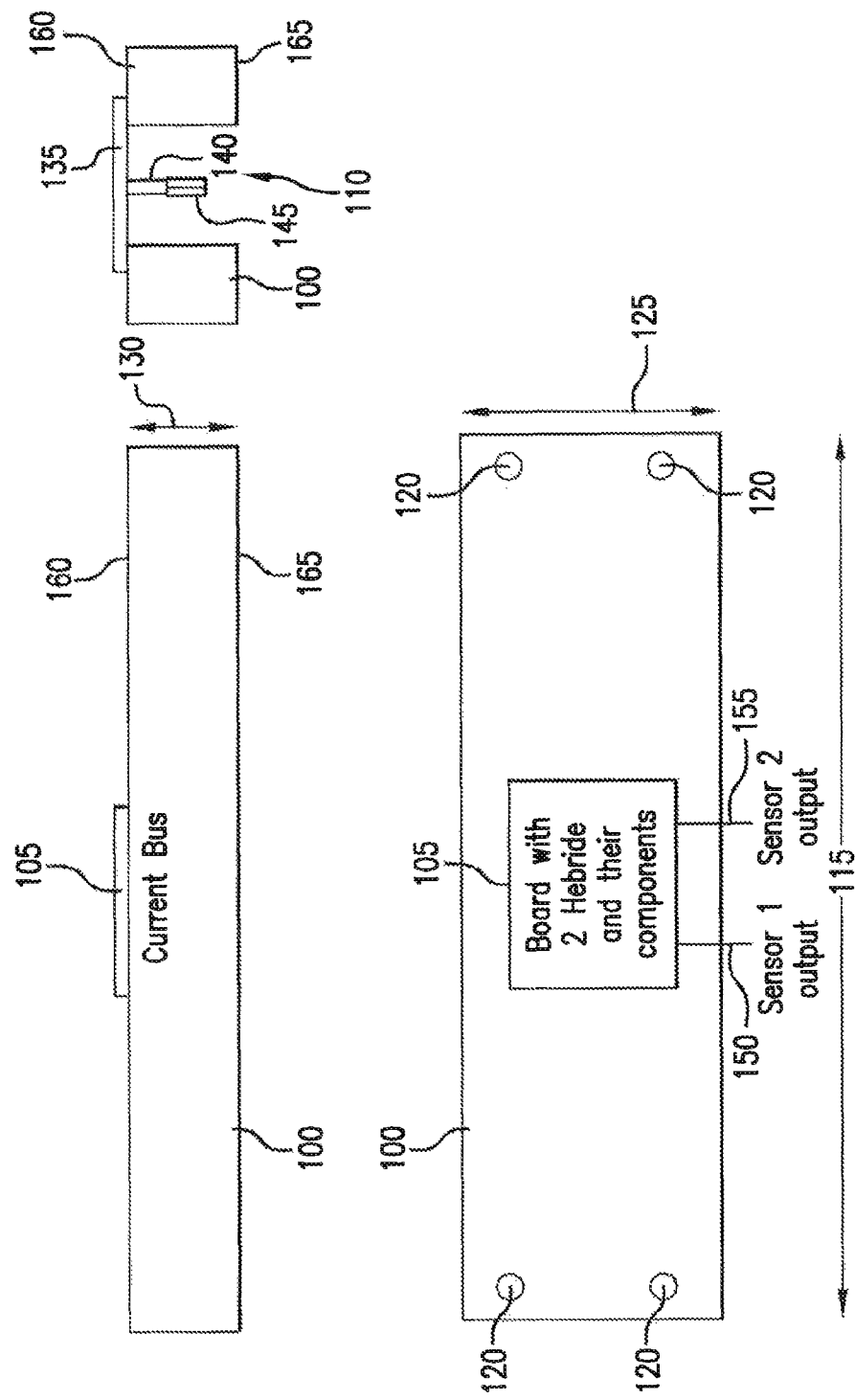
FIG. 1 depicts a schematic drawing of a current carrying bus bar with an in-hole current sensor.

FIG. 1 depicts a schematic drawing of a current carrying bus bar with an in-hole current sensor. In FIG. 1, a bus bar 100 has a current sensing system 105 within a hole 110. The bus bar 100 may carry high-current. The bus bar may be made of copper. In some embodiments, the bus bar may be made of aluminum. The bus bar 100 has a length 115 in the direction of current flow. At the ends of the length 115 are shown holes 120 for mounting the bus bar to current carrying conductors. The bus bar 100 has a width 125 and a depth 130. The hole 110 traverses the entire depth 130. The current sensing system 105 may have a circuit board 135 and a sensor projection 140. On the sensor projection may be a sensor array 145. In the depicted embodiment two sensor outputs 150, 155 are shown. The sensor array 145 is located substantially half way between a top surface 160 and a bottom surface 165 of the bus bar. The hole 110 is fashioned substantially in the middle of the width of the bus bar, and the sensor array 145 is located substantially in the middle of the hole 110. The sensor array may be located in such a fashion so that a magnetic field is very modest, the magnetic field resulting from a longitudinal current flow in the bus bar. The magnetic field at the center of such a hole may be small enough to permit the use of very sensitive magnetic-field sensors even for measuring large bus bar currents.

Figure 2:
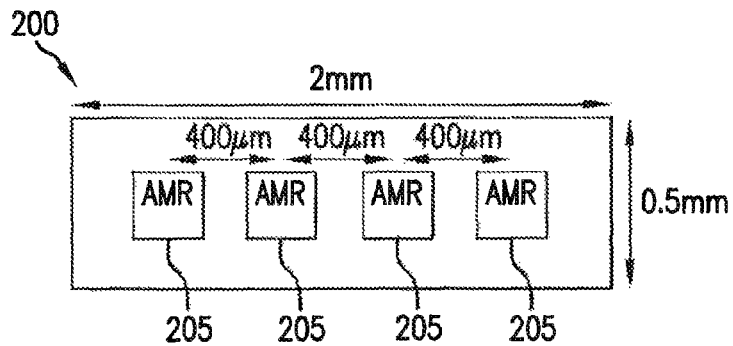
FIG. 2 depicts block diagram of an exemplary four sensor device for use in a position-insensitive stray-rejecting in-hole current sensor.

FIG. 2 depicts block diagram of an exemplary four sensor device for use in a position-insensitive stray-rejecting in-hole current sensor. In FIG. 2, an array 200 of Anisotropic MagnetorResistive (AMR) sensors 205 is depicted. The array 200 may be fabricated upon a single silicon substrate, for example. In some embodiments separate sensors may be positioned adjacent to one another on a circuit board. Each AMR sensor 205 may be precisely separated one from another. The separation may result in each sensor measuring a magnetic field at a slightly different position within the hole 110. The AMR sensors 205, being fabricated on the same substrate, may respond similarly to a magnetic field. Good uniformity of sensor response may simplify sensor calibration. Sensor spacing may be very precise, which may minimize errors resulting from sensor spacing variations. The sensors may be located within a small distance one from another. Such close separation may permit the sensors 205 to all be located in a low magnetic field region of the hole 110. Because the sensors may be located at a low-field position, a current in an offset strap may be sized to correspond to the expected maximum field of the array. In some embodiments, the magnetic field incident upon the sensor may be further decreased by providing an additional current-carrying conductor in close proximity to the sensor. The current carried by the conductor can be predetermined and established in an open-loop fashion. In some embodiments, the current can be determined in a close-loop fashion. In an exemplary embodiment, the field sensor measurement may be driven to zero by this feedback mechanism. In some embodiments, each current sensor may have an offset strap integrated on the same die as the sensor. The offset strap may carry current for the purpose of reducing or nulling the magnetic field incident upon the sensor.

Figure 3:
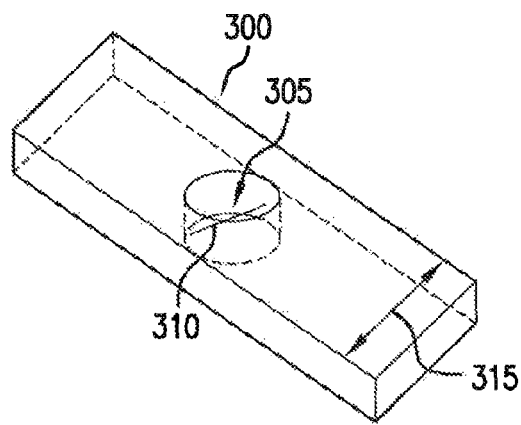
FIG. 3 depicts a perspective drawing of a bus bar with a hole for an in-hole sensor.

FIG. 3 depicts a perspective drawing of a bus bar with a hole for an in-hole sensor. In FIG. 3, an exemplary bus bar 300 includes a circular hole 305 for use in an exemplary in-hole current-measurement system. An x-axis 310 defines an diameter of the hole 305 aligned with a width 315 of the bus bar 300. A y-axis would be directed along a length of the bus bar 300. The field sensors 205 may be positioned along the x-axis 310 and aligned to detect a magnetic field directed in a z-direction. The z-direction would be aligned with a thickness of the bus bar 300. The magnetic field sensors 205 may be positioned along the x-axis 310 which is depicted to be located midway within the depth of the hole 305.

Figure 4:
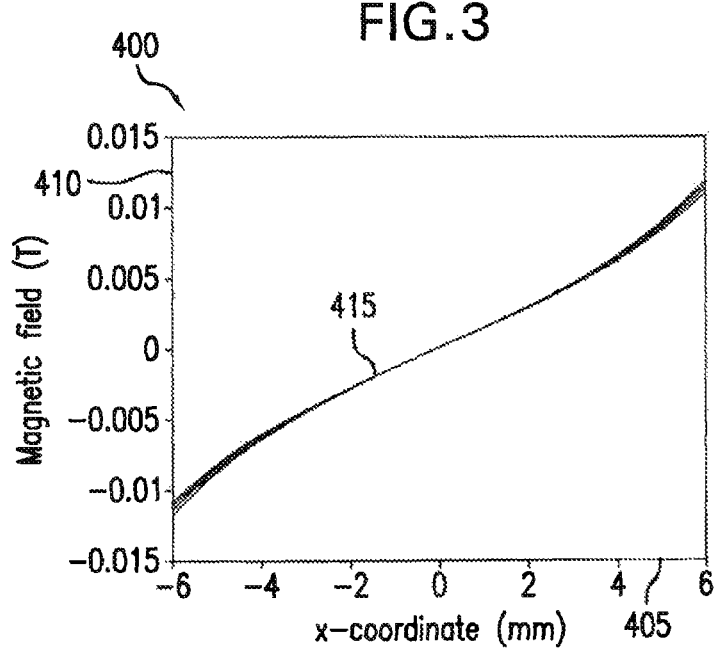
FIG. 4 depicts a graph of simulated magnetic field as a function of position within a hole.

FIG. 4 depicts a graph of simulated magnetic field as a function of position within a hole. In FIG. 4, a graph 400 has an x-axis 405 which represents the locations along the x-axis 310 at which a magnetic field sensor 205 is located. The graph 400 has a y-axis 410 indicating the magnetic field strength measured by the magnetic field sensor 205. A function 415 indicates a functional relationship between sensor location and measured field strength. The function 415 indicates a cubic relationship between the x-location of the sensor and the measure magnetic field strength. This relationship may result from the hole geometry. Various hole geometries may produce different functional relationships, for example. In some embodiments, the sensors may be aligned to measure the magnetic field in a direction different than the z-direction. For example a y-direction magnetic field may be measured.

Figure 5:
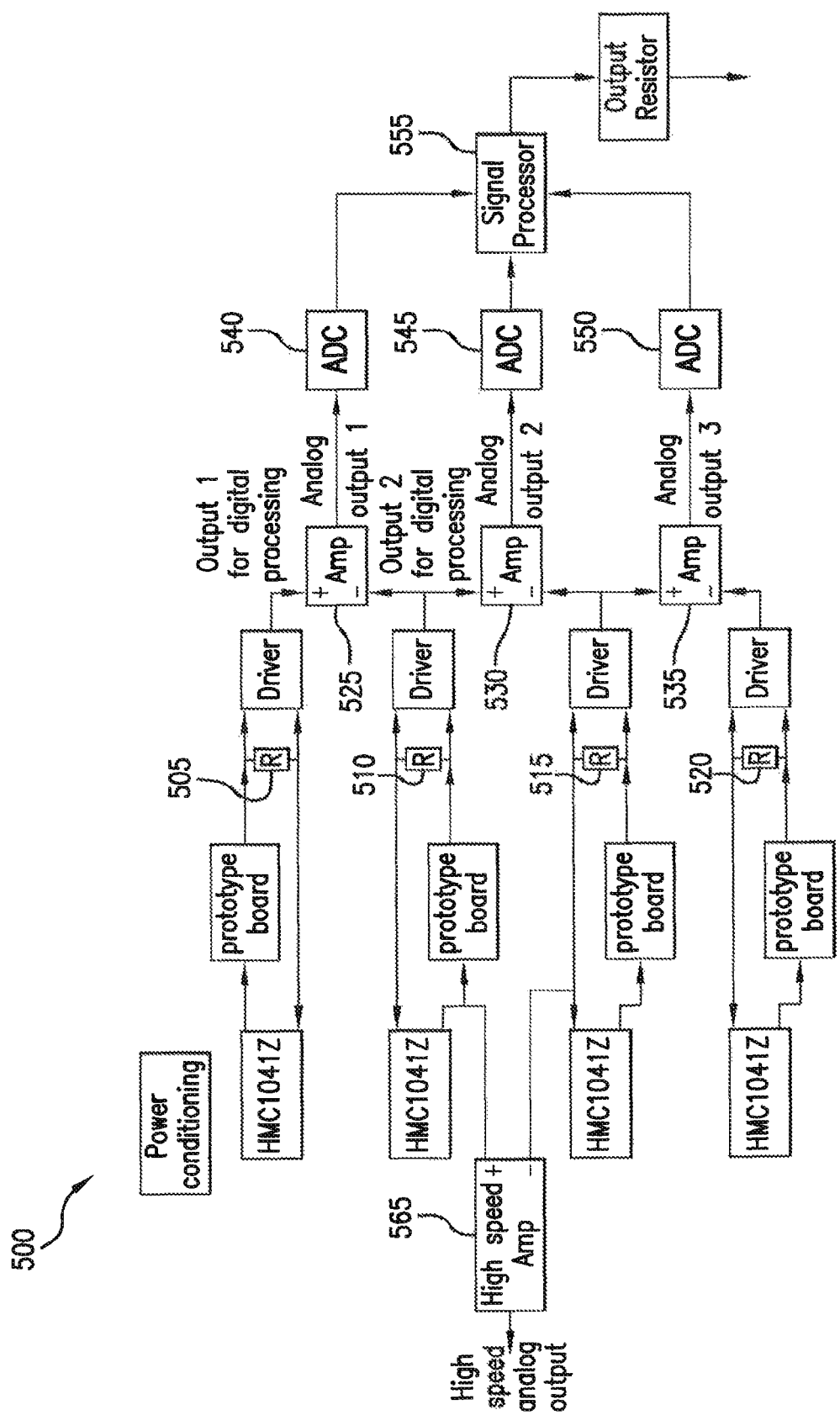
FIG. 5 depicts a block diagram of an exemplary embodiment of an in-hole current sensing system.

FIG. 5 depicts a block diagram of an exemplary embodiment of an in-hole current sensing system. FIG. 5 depicts a system 500 of using multiple magnetic field sensors to accurately measure current flow. The magnetic field sensors may be distributed along a line transverse to the direction of current flow and within a hole in the conductor carrying the current. The depicted system 500 includes four magnetic field sensors 505, 510, 515, 520. Three differential amplifiers 525, 530, 535 compute the difference between the signals of adjacent pairs of sensors. The difference signals are then digitized by ADCs 540, 545, 550 and sent to a signal processing unit 555. A high-speed amplifier 565 bypasses the ADCs 540, 545, 550 to provide a fast response to rapid electrical current changes. Such a fast response may be used to report a short circuit event, for example. In some embodiments, the high-speed amplifier 565 may respond to current changes in as little as one micro-second. The signal processing unit 555 computes a coefficient for a desired modeling term of the modeled functional relationship of the measured magnetic field strength to the sensor position. In some embodiments, the computed coefficient is the highest-order term of a polynomial model, for example. The coefficient for the highest-order term may be substantially invariant to the actual sensor array position within the hole. In some embodiments more than one term coefficient may be computed. The computed term coefficients may be combined for use as a current indicator. The computed term coefficients may be combined so as to minimize the combined response to a stray field, for example.

Sensor alignment variations within the hole may result in a coordinate transformation of the functional model. Coordinate transformations may result in a change to some of the modeling term coefficients. Some of the modeling term coefficients may be invariant to coordinate transformations. Using invariant terms to measure the current may reduce the sensitivity to alignment. Some of the coefficients may be less sensitive to stray fields, for example. Using substantially stray-invariant coefficients may reduce the sensitivity to nearby conductors, for example. There are many different ways to compute a modeling term coefficient. In the depicted embodiment, signal differences between adjacent sensors are used to reduce the order of the polynomial by one degree. Other embodiments may use the sensor signals themselves and not the differences between adjacent sensors. One may use a four term polynomial model:

$$z = dx^3 + cx^2 + bx + a$$

The coefficients of this model may be determined if one knows the positions of the sensors within the hole relative to an assigned coordinate system. The zero of the coordinate system may be chosen such that the center of the hole in the bus bar is the zero location. If one uses four sensors, the highest order coefficient can be obtained by solving the series of equations:

$$\begin{bmatrix} 1 & -1.5\Delta & 2.25\Delta^2 & -3.375\Delta^3 \\ 1 & -0.5\Delta & 0.25\Delta^2 & -0.125\Delta^3 \\ 1 & 0.5\Delta & 0.25\Delta^2 & 0.125\Delta^3 \\ 1 & 1.5\Delta & 2.25\Delta^2 & 3.375\Delta^3 \end{bmatrix} \begin{bmatrix} a \\ b \\ c \\ d \end{bmatrix} = \begin{bmatrix} z_1 \\ z_2 \\ z_3 \\ z_4 \end{bmatrix}$$

The solution to the above system of equations can be simply solved by inverting the matrix and multiplying the inverted matrix by the four magnetic field measurements ($z_1$, $z_2$, $z_3$, $z_4$). The d coefficient here represents the cubic coefficient. If one assumes the □ scaling terms into the coefficients (a, b, c, and d), one finds:

$$d = -0.167z_1 + 0.5z_2 - 0.5z_3 + 0.167z_4$$

If one were to use more than four magnetic field sensors, one could still obtain a cubic coefficient by simply regressing the measured data to obtain the coefficients for a cubic function. The following system of equations would represent a five-sensor system:

$$\begin{bmatrix} 1 & -2\Delta & 4\Delta^2 & -8\Delta^3 \\ 1 & -1\Delta & 1\Delta^2 & -1\Delta^3 \\ 1 & 0 & 0 & 0 \\ 1 & 1\Delta & 1\Delta^2 & 1\Delta^3 \\ 1 & 2\Delta & 4\Delta^2 & 8\Delta^2 \end{bmatrix} \begin{bmatrix} a \\ b \\ c \\ d \end{bmatrix} = \begin{bmatrix} z_1 \\ z_2 \\ z_3 \\ z_4 \\ z_5 \end{bmatrix}$$

The solution to the above system of equations can be simply solved by multiplying the measurement results ($z_1$, $z_2$, $z_3$, $z_4$, $z_5$) by the regression matrix. The regression matrix can be simply obtained using the A matrix, which multiplies the coefficient array (a, b, c, d). The regression is performed as follows:

$$\begin{bmatrix} a \\ b \\ c \\ d \end{bmatrix} = (A^T A)^{-1} A^T \begin{bmatrix} z_1 \\ z_2 \\ z_3 \\ z_4 \\ z_5 \end{bmatrix}$$

The d coefficient here again represents the cubic coefficient. Here $A^T$ represents the transpose of the A matrix. When performing the above operation, only the d coefficient is needed. For the above example, the following d coefficient is found using the following equation:

$$d = -0.083z_1 + 0.167z_2 - 0.167z_4 + 0.083z_5$$

Interestingly, the third (middle) sensor (z3) is not used in the regression result. And using six uniformly spaced sensors results in:

$$d = -0.046z_1 + 0.065z_2 + 0.037z_3 - 0.037z_4 - 0.065z_5 + 0.046z_6$$

Figure 6:
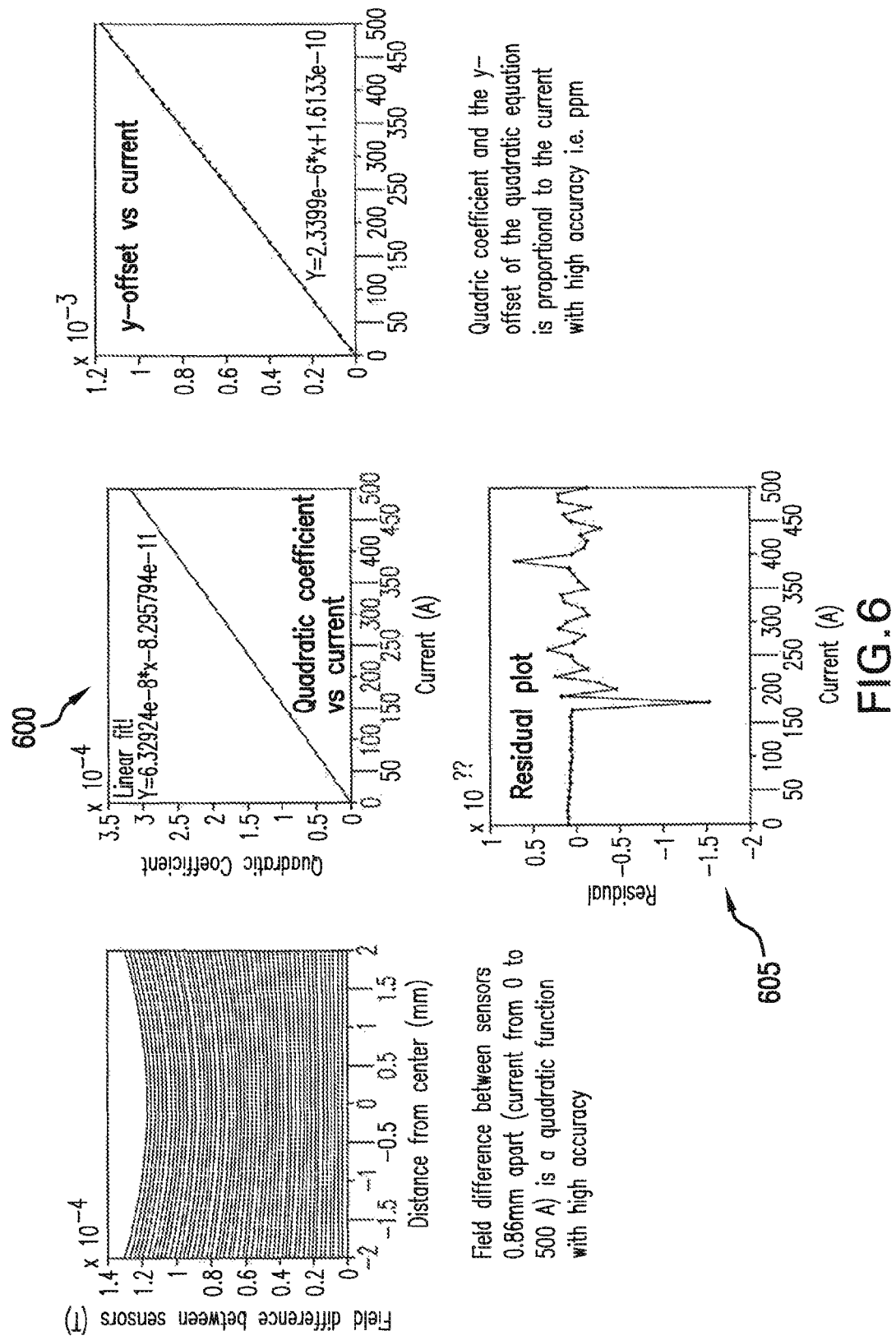
FIG. 6 depicts three-dimensional finite-element simulation results of an experimental in-hole current measurement system.

FIG. 6 depicts three-dimensional finite-element simulation results of an experimental in-hole current measurement system. In FIG. 6 a graph 600 shows that a quadratic coefficient for the system shows good (linear) correlation to the current in the bus bar. This quadratic coefficient may represent the system of FIG. 5 in which the differences between adjacent sensors are used as inputs. In such a system, as will be shown, the quadratic coefficient is related to the cubic coefficient of the solution obtained using the sensor outputs themselves as inputs as described above. Also shown in FIG. 6 is a graph 605 depicting the difference between the quadratic fit to that actual current. This may represent the error in using the quadratic coefficient as a measure of current.

Figure 7:
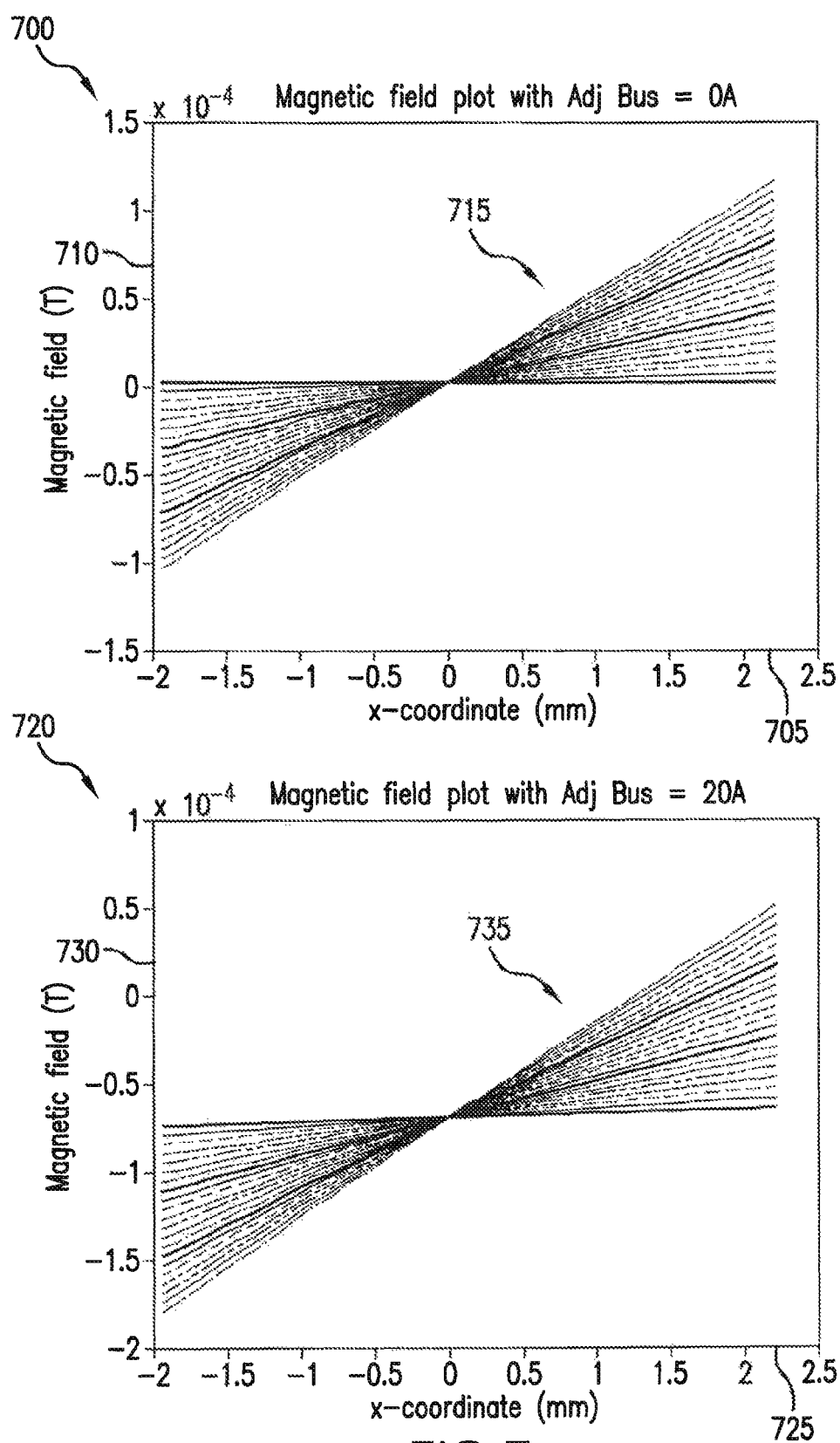
FIG. 7 depicts experimental measurement results of the magnetic field as a function of current and position within an in-hole bus bar.

FIG. 7 depicts experimental measurement results of the magnetic field as a function of current and position within an in-hole bus bar. In FIG. 7 a graph 700 has an x-axis 705 indicating the x-location of a magnetic field sensor. The graph 700 also has a y-axis 710 indicating the measurement of the magnetic field. Each line 715 corresponds to a different value of current flowing in a conductor. As the current increases, the slope of the field measurement increases. The graph 720 has an x-axis 725 indicating the x-location of a magnetic field sensor. The graph 720 also has a y-axis 730 indicating the measure magnetic field. Again each line 735 corresponds to a value of current flowing in a conductor. The graph 720 differs from the graph 700 because in graph 720, a stray conductor is carrying a large current (e.g. 20 Amps). The stray conductor is located immediately adjacent to the conductor whose current is being measured. The graph 720 is substantially translated in the y-axis direction as a result of the 20 Amps of current flowing in the adjacent conductor. The functional dependencies of the magnetic field measurements to x-location are otherwise substantially invariant to the stray current. This graph indicates that using the high-order functional coefficient to measure the current may provide a measure of stray rejection.

Figure 8:
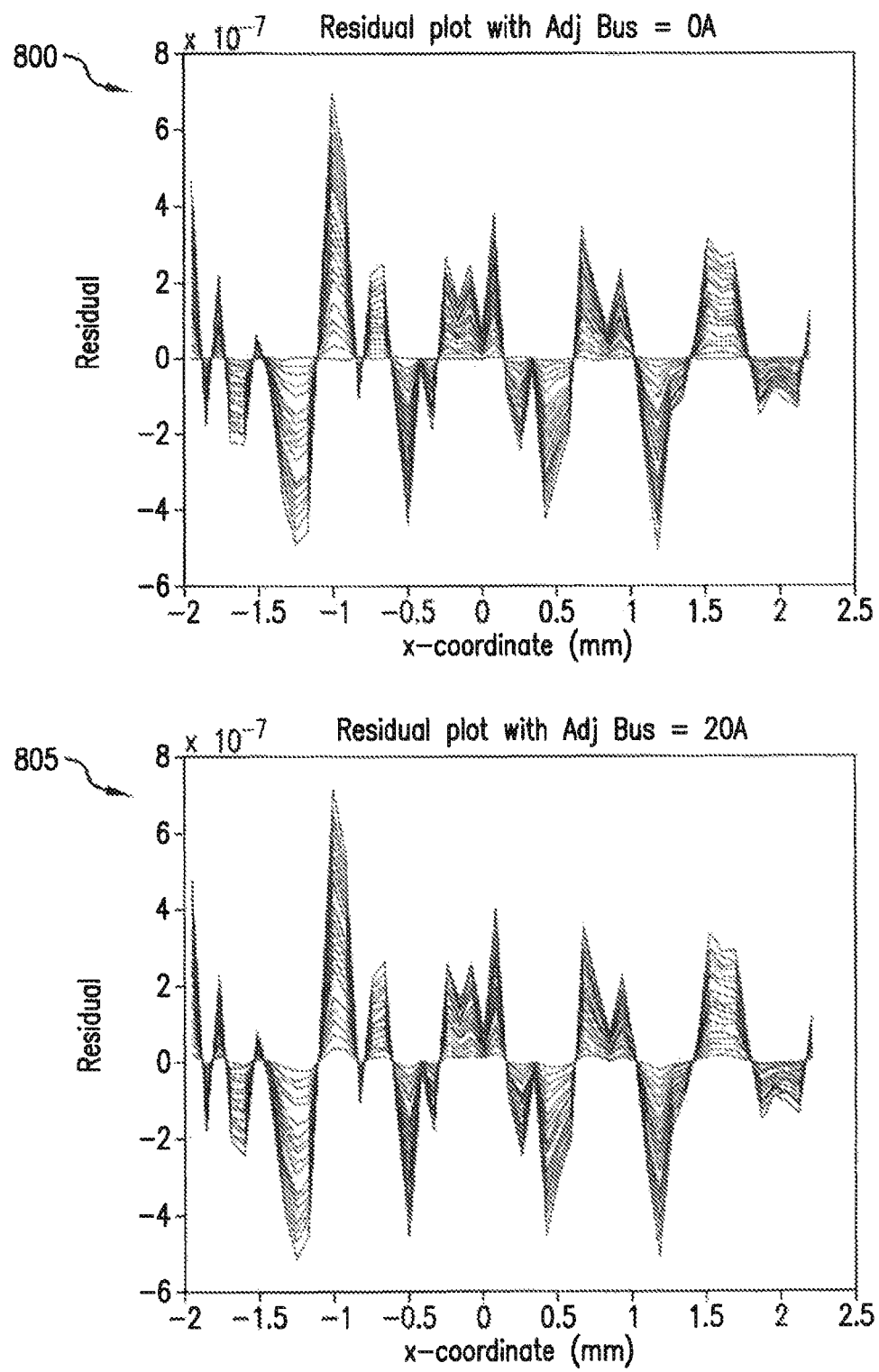
FIG. 8 depicts the residual error between measurement and a cubic curve-fit.

FIG. 8 depicts the residual error between measurement and a cubic curve-fit. In FIG. 8 a graph 800 indicates the residual difference between the cubic curve fit for each of the lines 715 and a cubic function fit to the lines 715. The lines 715 represent measured magnetic field data with no current flowing in an adjacent conductor. In FIG. 8 a graph 805 indicates the residual difference between the cubic curve fit for each of the lines 735 and a cubic function fit to the lines 735. The lines 735 represent measured magnetic field data with 20 Amps of current flowing in and adjacent conductor. The residual error appears uncorrelated the next lowest order polynomial terms. Thus, the polynomial model used may be sufficient to well-model the system.

Figure 9:
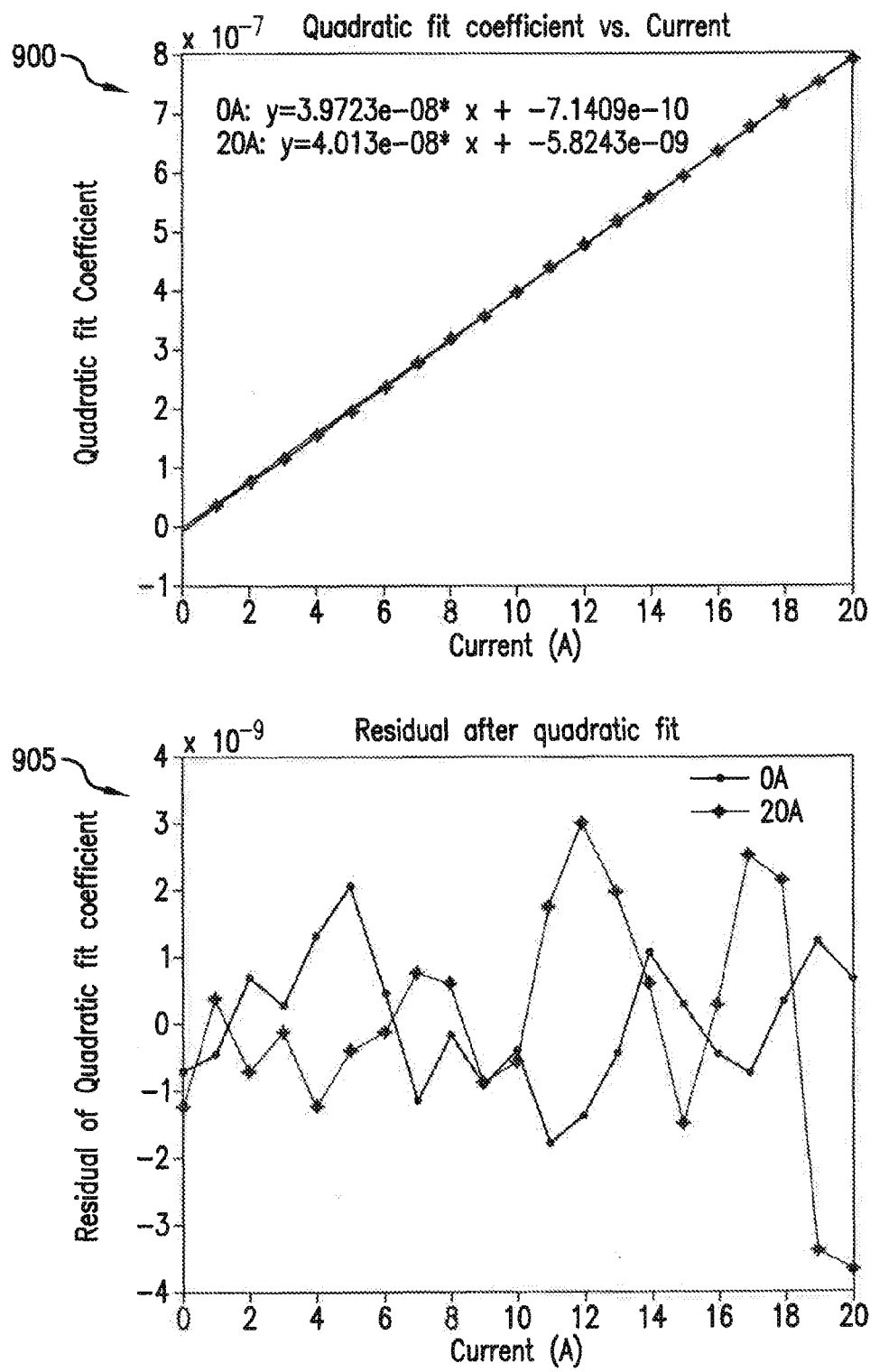
FIG. 9 depicts experimental results of an exemplary difference solution of an in-hole current measurement system.
Figure 10:
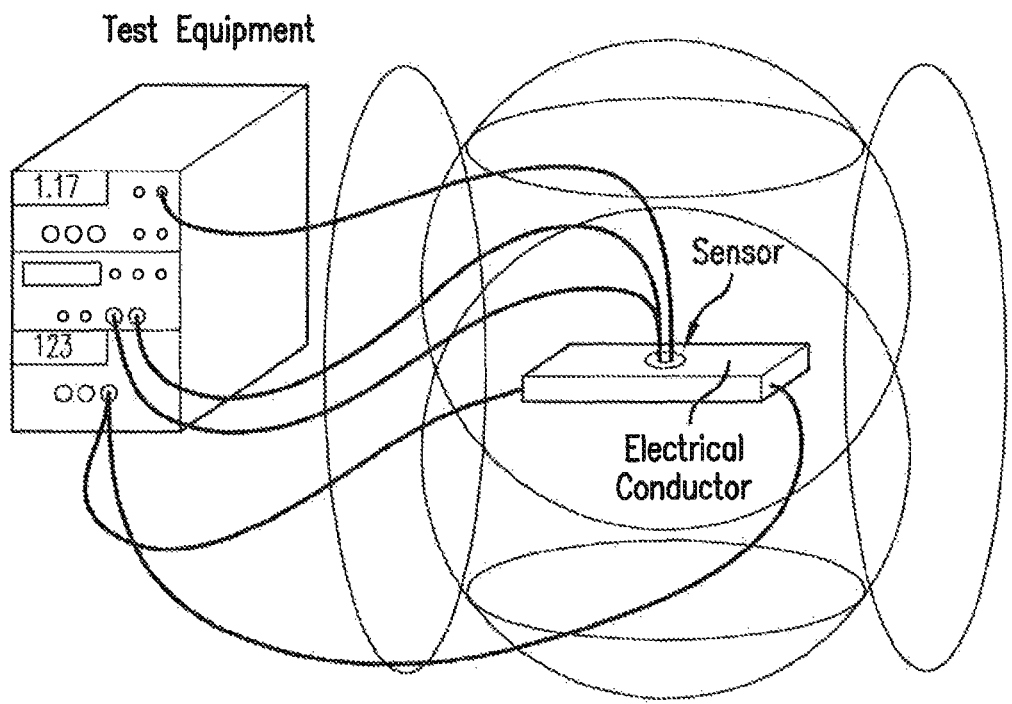
FIG. 10 depicts photos of the experimental setup for collecting experimental data of an in-hole current measurement system.

FIG. 9 depicts experimental results of an exemplary difference solution of an in-hole current measurement system. In FIG. 9 a graph 900 depicts the relationship between a quadratic coefficient of the difference between adjacent magnetic field sensors and the current flow. Also in FIG. 9, a graph 905 depicts an error between the current predicted by the quadric coefficient fit and the actual current flowing in the conductor. FIG. 10 depicts photos of the experimental setup for collecting experimental data of an in-hole current measurement system.

Figure 11:
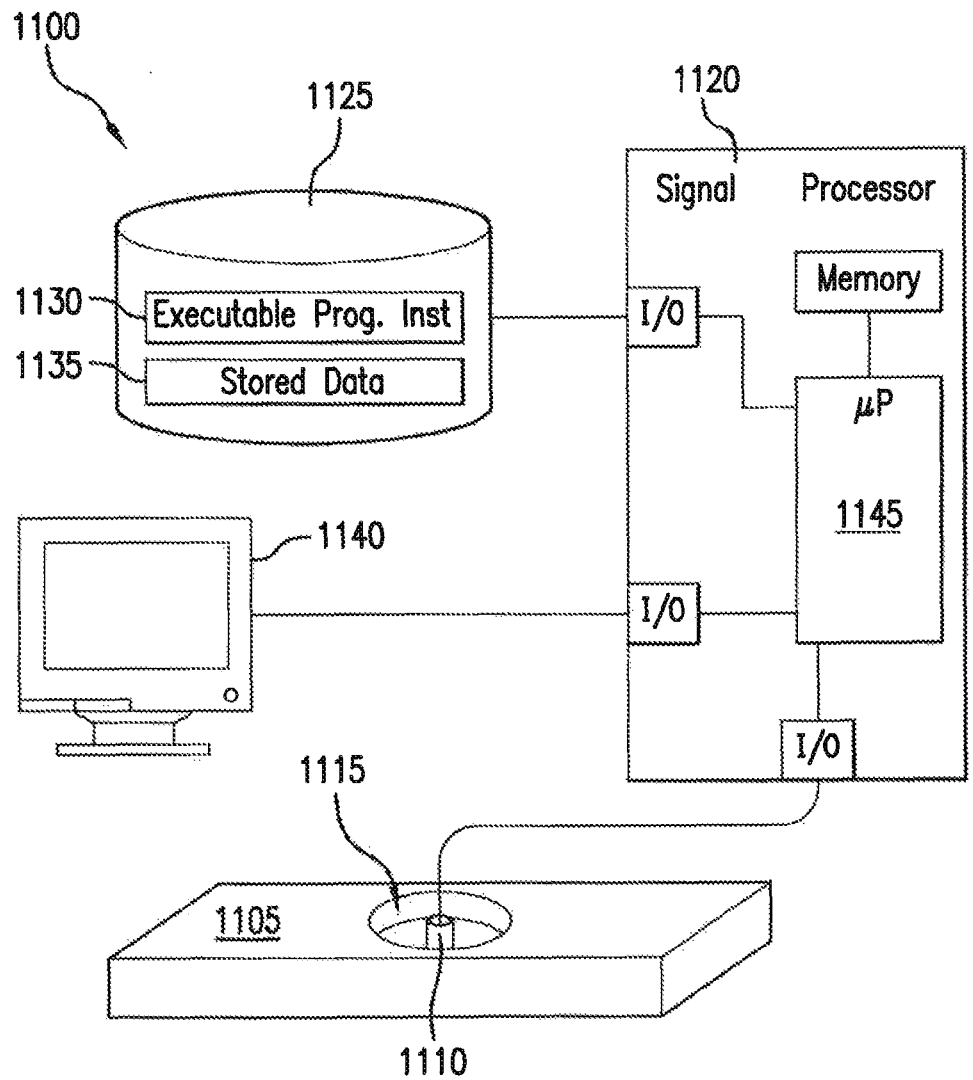
FIG. 11 depicts an exemplary system for measuring current using an array of sensors located in a hole in a conductor.

FIG. 11 depicts an exemplary system for measuring current using an array of sensors located in a hole in a conductor. In this figure, an exemplary system 1100 for measuring current includes a bus bar 1105 with a sensor array 1110 position in a hole 1115. The system 1100 has a signal processor 1120 configured to receive the signals representing the magnetic field measurements of the sensor array 1110. Various embodiments may use different types of processors. For example some embodiments may use a microcontroller. In some embodiments an FPGA may be used. Some embodiments may employ PLDs, for example. The signal processor 1120 is connected to non-volatile memory 1125. The signal processor has a microprocessor 1145 for executing instructions for calculating a signal representative of a current flowing in the bus bar 1105. The non-volatile memory 1125 contains both program-memory locations 1130 and data-memory locations 1135. The program-memory locations 1130 may store the instructions that are executed by the microprocessor 1120. The signal processor 1120 may process the data received from the sensor array 1110 and produce a measurement indicative of the current in the bus bar 1105. The measurement data may be logged in data memory 1135. The measurement data may be displayed for view by a user on a computer display 1140. In some embodiments an alarm may be sounded if the measurement exceeds a predetermined threshold, for example.

It has been observed that the magnetic field in the z-direction has a cubic dependence with x-position. A cubic polynomial has four coefficients. A series of four sensors may measure the magnetic field in the z-direction at four adjacent x-locations. One need not know the exact x-locations, but simply the relative x-offset between adjacent x-locations to determine the cubic coefficient. The cubic coefficient is substantially insensitive to the exact x-location of the sensors. One can observe this by simplifying a cubic polynomial with an unknown x-offset:

$$z = d(x-x_0)^3 + c(x-x_0)^2 + b(x-x_0) + a$$

Simplifying:

$$z = dx^3 + (c-3dx_0)x^2 + (b-2bc+3dx_0^2)x + (a-bx_0+2cx_0^2 - dx_0^3)$$

As can be seen from the above equation, the cubic coefficient has no dependency on the offset term ($x_0$). Thus, if one can obtain the cubic coefficient from the measurement of the four sensors, one may obtain a measure of the current. One way to obtain a measure of the cubic coefficient is to simplify the equation by using the derivative of the equation:

$$\frac{\partial z}{\partial x} = 3dx^2 + 2(c - 3dx_0)x + (b - 2cx_0 + 3dx_0^2)$$

Taking the difference between measurements of two adjacent sensors approximates taking the derivative of the measurements:

$$\frac{(z_2 - z_1)}{\Delta} \approx 3dx^2 + 2(c - 3dx_0)x + (b - 2bc + 3dx_0^2)$$

Here $\Delta$ is simply the x-distance between adjacent sensors. Thus, one simply needs to obtain the quadratic coefficient of the above difference equation to obtain a measure of the original cubic coefficient. Note that the two adjacent difference equations are:

$$\frac{(z_3 - z_2)}{\Delta} \approx 3d(x+\Delta)^2 + 2(c - 3dx_0)(x+\Delta) + (b - 2cx_0 + 3dx_0^2)$$

-continued $$\frac{(z_4 - z_3)}{\Delta} \approx 3d(x + 2\Delta)^2 + 2(c - 3dx_0)(x + 2\Delta) + (b - 2cx_0 + 3dx_0^2)$$

Combining the above three difference equations yields:

$$3d = \frac{(z_2 - z_1) - 2(z_3 - z_2) + (z_4 - z_3)}{2\Delta^2}$$

Now that the cubic coefficient has been obtained in this manner, it may be used as a metric of the current within the conductor. Note also that if one simplifies the above solution one can see that it is equal to the solution obtained by inverse matrix methods:

$$d\Delta^2 = -0.167z_1 + 0.5z_2 - 0.5z_3 + 0.167z_4$$

Figure 12:
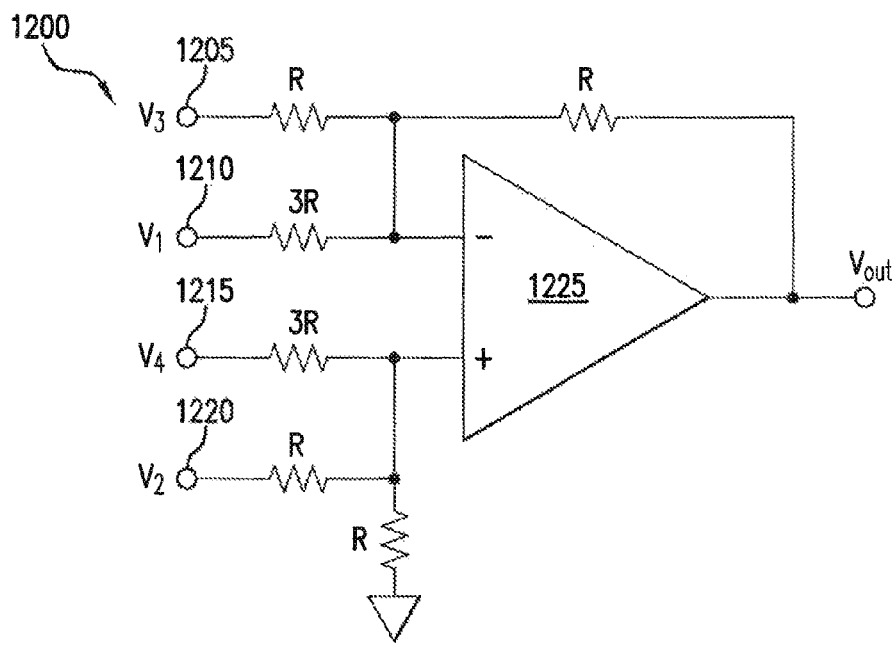
FIG. 12 depicts a schematic of an exemplary signal processing circuit for an exemplary in-hole current measurement system.

FIG. 12 depicts a schematic of an exemplary signal processing circuit for an exemplary in-hole current measurement system. In FIG. 12, an exemplary signal processing circuit 1200 may perform the receive inputs from four adjacent magnetic field sensors. Each magnetic field sensor may provide a voltage to an input node 1205, 1210, 1215, 1220. An op-amp 1225 may be used in the signal processing circuit 1200. The transfer function for this signal processing circuit may be:

$$V_{out} = -0.333z_1 + z_2 - z_3 + 0.333z_4$$

Figure 13:
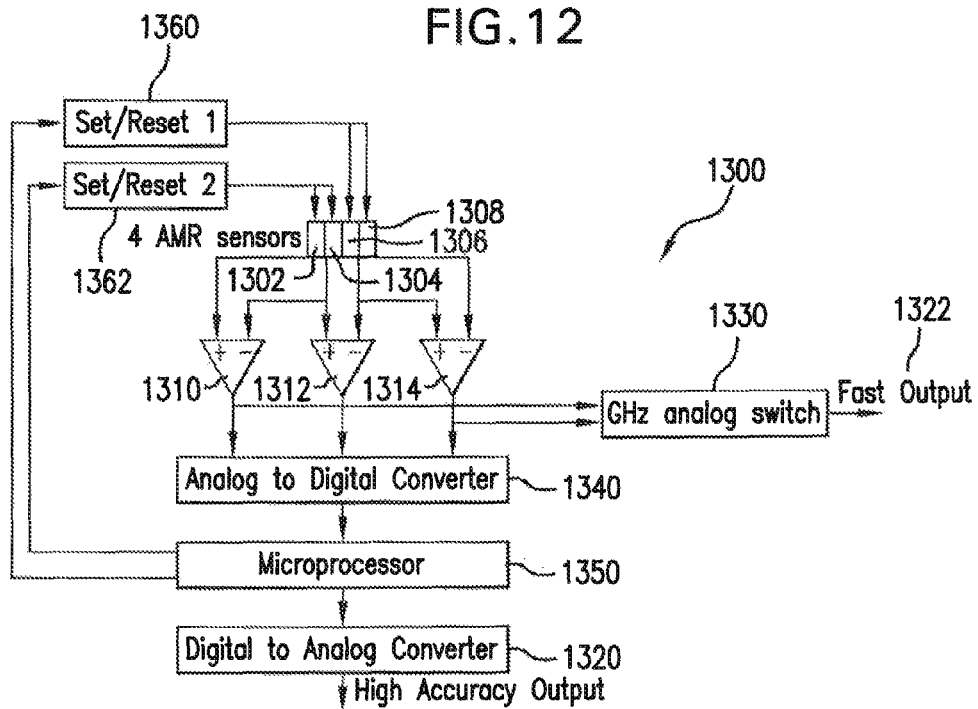
FIG. 13 depicts a block diagram of an exemplary transient-disturbance-tolerant in-hole current-measurement system.

FIG. 13 depicts a block diagram of an exemplary transient-disturbance-tolerant in-hole current-measurement system. In the FIG. 13 embodiment, an exemplary in-hole current-measurement system 1300 includes four distinct AMR sensors 1302, 1304, 1306, 1308. The four AMR sensors 1302, 1304, 1306, and 1308 are grouped into two pairs; a first pair includes sensors 1302 and 1304. The second pair includes sensors 1306, 1308. Three difference amplifiers 1310, 1312, 1314 have their input nodes connected to two of the output nodes of two of the AMR sensors. The outputs of the first and second AMR sensors 1302, 1304 connect to the first difference amplifier 1310. The outputs of the second and third AMR sensors 1304, 1306 connect to the second difference amplifier 1312. And the outputs of the third and fourth AMR sensors 1306, 1308 connect to the third difference amplifier 1314. In this way, the first and third difference amplifiers are connected to mutually exclusive pairs of AMR sensors.

The in-hole current-measurement system 1300 generates a periodic high-accuracy output 1320 and a fast output 1322. A high speed analog switch 1330 connects either the output of the first difference amplifier 1310 or the third difference amplifier 1314 to the fast output node 1322. This selection between the first and third difference amplifiers permits the fast output node 1322 to be always driven by one of these difference amplifiers. If, for example, the first AMR sensor 1302 is experiencing a transient disturbance, the high speed analog switch 1330 can select the output of the third difference amplifier 1314, which in turn is connected to the outputs of the undisturbed third and fourth AMR sensors. If, on the other hand, the third AMR sensor is experiencing a transient disturbance, the high speed analog switch 1330 can select the output of the first difference amplifier 1310, which in turn is connected to the outputs of the undisturbed first and second AMR sensors.

The fast output 1322 can provide a signal representative of the current in the electrical conductor throughout a transient disturbance that affects only one of the first and third difference amplifiers. The fast output may be connected to threshold detection circuit. The threshold detection circuit may report a short circuit event if the fast output signal exceeds a predetermined threshold, for example. In some embodiments, a circuit breaker may be tripped (opened) if such a predetermined threshold is exceeded. The difference between adjacent AMR sensors may be approximately proportional to the electrical current flowing in the electrical conductor. And the difference between the third and fourth AMR sensors may be approximately equal in response to an electrical current as the difference between the first and the second AMR sensors, for example. Although the difference between pairs of adjacent AMR sensors may be approximately equal, small differences may arise. But these differences may be not significant for the system purposes of the fast output signal.

The output of all three of the difference amplifiers are shown connected to an Analog-to-Digital Converter (ADC) 1340. The ADC 1340 may have three input channels for converting all three signals, for example. The ADC 1340 may convert all three of the input channels in parallel. In some embodiments, the ADC 1340 may serially convert each of the three difference amplifier outputs. An analog multiplexer may sequence through each of the three channels to obtain three digital representations of the three difference amplifier outputs. The ADC 1340 may have three sample-and-hold circuits that simultaneously sample the three input channels. Simultaneous sampling may ensure that the sampled signals are all representative of the same sampling time. The output of the ADC 1340 is connected to a microprocessor 1350. The microprocessor 1350 may perform calculations to convert the digital representations of the output signals of the difference amplifiers to a signal representative of the electrical current in the electrical conductor. For example, the microprocessor 1350 may perform some of the calculations described in the description above.

The microprocessor 1350 may also schedule the setting and resetting of the alignment of magnetic domains in the AMR sensors. The setting and resetting of the magnetic domains of the AMR sensors may permit the determination of an offset of a Wheatstone bridge arrangement, for example. The setting and resetting of the magnetic domains in the AMR sensors may align the magnetic domains parallel to an easy axis. In some embodiments, periodically aligning the magnetic domains of the ARM sensors may facilitate precise sensor measurements of magnetic fields. The AMR sensors may have a set/reset conductor that passes directly over and/or under the AMR sensors in a substantially perpendicular direction to the easy axis of the AMR sensors. If the set/reset strap runs both over and under the AMR sensor, the current flow within the conductor running over the AMR sensor must be anti-parallel to the current flow in within the conductor running under the AMR strap for proper set/reset operation. The current flow may be in one direction for the set operation and in the opposite direction in the reset operation. The magnetic field directions will be governed by the right-hand rule used in magnetic fields originating by a flow of charged particles.

Figure 14:
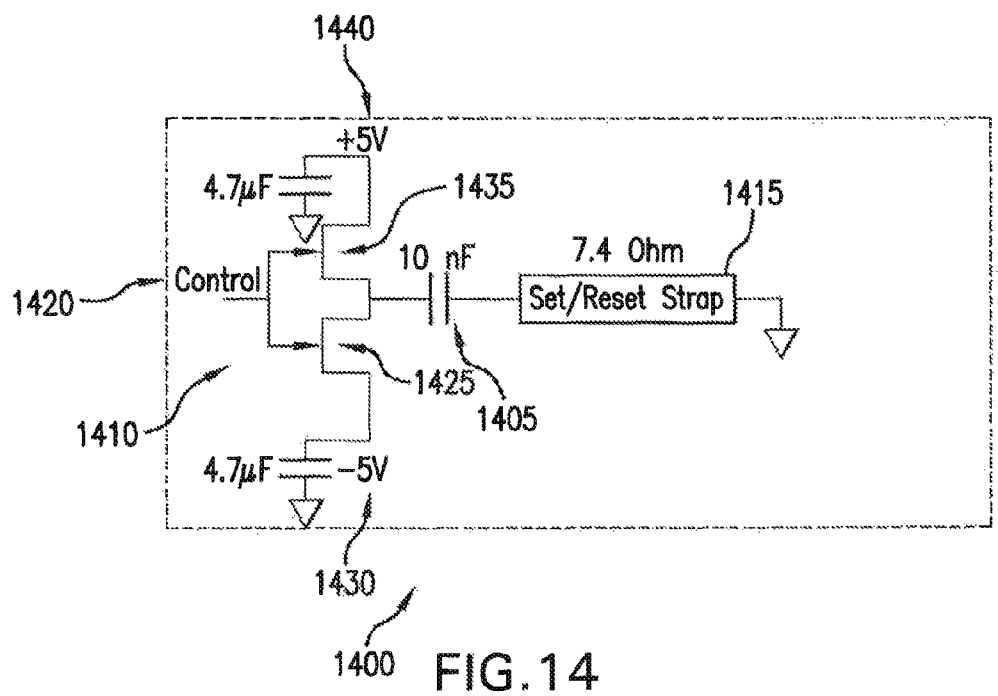
FIG. 14 depicts an exemplary set/reset circuit for aligning magnetic domains in an AMR sensor.

FIG. 14 depicts an exemplary set/reset circuit for aligning magnetic domains in an AMR sensor. In the FIG. 14 depiction, an exemplary set/reset circuit 1400 includes a capacitor 1405 connected between a set/reset strap 1410 and the output of an inverter 1415. When a control signal 1420 is high, a transistor 1425 connects an inverter side of the capacitor to a negative supply 1430. The set/reset side of the capacitor is connected to ground through the conductive set/reset strap 1415. In this way, the capacitor 1405 will be charged with a 5 volt difference across its terminals (for a −5 volt negative supply as indicated in the figure). When the control signal 1420 goes low, a transistor 1435 connects the inverter side of the capacitor 1405 to a positive supply 1440 (in this case +5 volts). The set/reset side of the capacity will instantaneously be at 10 volts, thereby providing a 10 volt difference across the set/reset strap 1415. The set/reset strap 1415 is typically of low-resistance metal and thus the capacitor 1405 will be soon discharged through the set/reset strap 1415. But this discharge event itself may create a large current in the set/reset strap 1415. The large current may generate a large field—one that is sufficient to align the magnetic domains of the AMR sensors parallel with the easy axis. When the discharge is complete, the capacitor 1405 will have a −5 volt difference across its terminals. This prepares the capacitor 1405 for an oppositely directed discharge which may result in the magnetic field domains aligned antiparallel to that which resulted from the first discharge event. FIG. 13 depicts two distinct set/reset modules 1360, 1362. The first set/reset module 1360 performs the set/reset operation to the third and fourth AMR sensors 1306, 1308. The second set/reset module 1362 performs the set/reset operation to the first and second AMR sensors 1302, 1304. Thus, while the first set/reset module 1360 is operating on the third and fourth AMR sensors 1306, 1308, the first difference amplifier 1310 may be receiving outputs form the undisturbed first and second AMR sensors 1302, 1304. Then, when the second set/reset module 1362 is operating on the first and second AMR sensors 1302, 1304, the third difference amplifier 1314 may be receiving outputs from the undisturbed third and fourth AMR sensors 1306, 1308. The microprocessor 1350 may send the appropriate selection signal to the high speed analog switch 1330 to connect the appropriate undisturbed signal to the fast output 1322.

During such set/reset events. The AMR sensors to which the set/reset operation is applied may be temporarily disturbed by the set/reset event. The output signals of such disturbed AMR sensors may not accurately reflect the magnetic field incident upon the AMR sensor during the set/reset operation. The microprocessor 135 may select AMR signals that are not undergoing a set/reset event for connection to the fast output during such an operation. In this way, a set/reset operation may be performed on a subset of AMR sensors while permitting other sensors to measure the magnetic field induced by electrical current flow in the conductor.

Figure 15:
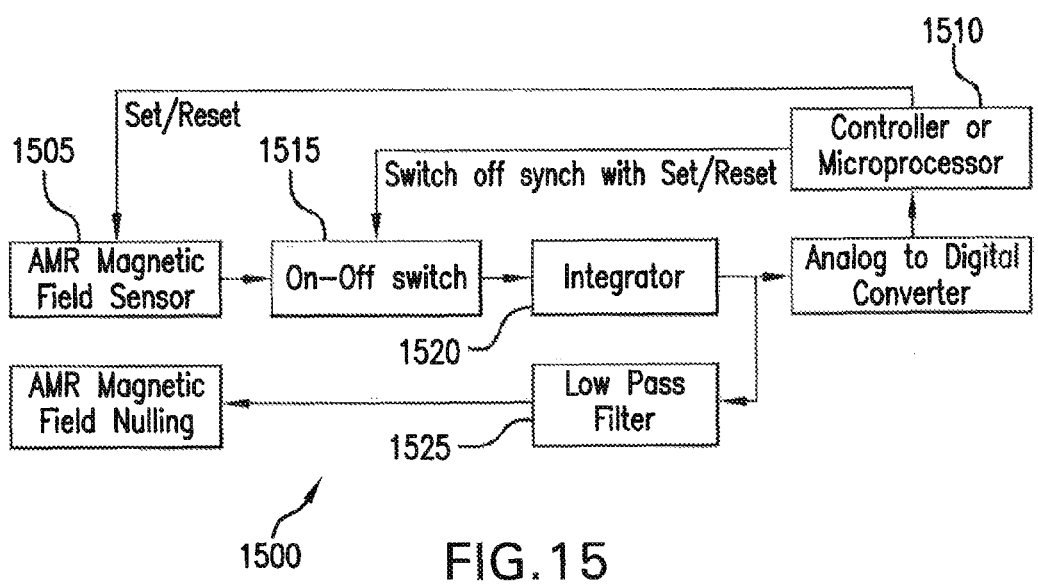
FIG. 15 depicts a block diagram of an exemplary AMR sensor system having set/reset and offset-nulling capabilities.

FIG. 15 depicts a block diagram of an exemplary AMR sensor system having set/reset and offset-nulling capabilities. In the FIG. 15 depiction, an exemplary AMR sensor system 1500 includes an AMR magnetic-field sensor 1505. A controller 1510 may control the timing of set/reset operations of the AMR magnetic-field sensor 1505. The magnetic field sensor 1505 may have a nulling strap. The nulling strap may be the same as the set/reset strap or it may be a different strap. The nulling strap may be used to correct for an offset of the Wheatstone bridge due to mismatched bridge elements, for example. The offset may be used in a closed-loop sensor operation that keeps the sensor nominally at a zero condition. If a magnetic field is incident upon the sensor, a closed-loop operation may generate a current in the offset strap that generates a magnetic field equal in magnitude to the external field but opposite in polarity to the external magnetic field. This current in the offset strap corresponds to the magnitude and direction of the external field. In this way, the current in the offset strap becomes a measure of the external magnetic field incident upon the AMR sensor.

While an AMR sensor is undergoing a set/reset operation to align the magnetic domains of the thin file (e.g. Permalloy), the offset nulling operation may be disabled. An analog switch 1510 may permit the controller to disable measurement and closed loop offset nulling during a set/reset operation. During a set/reset operation, disconnecting the output of an AMR sensor from the circuitry that is responsive to the output prevents these responsive circuits from wildly behaving during the set/reset operation. Such prevention may minimize the transient disturbance to the common connections (e.g. power supply lines, etc.) to other circuitry. In the depicted embodiment, an integrator 1520 and a low-pass filter 1525 may be in the closed loop nulling path.

Figure 16:
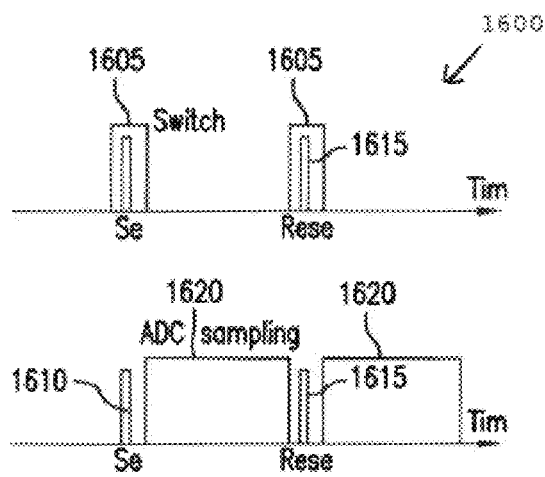
FIG. 16 depicts an exemplary timing diagram showing Set/Reset selection and ADC sampling timing.

FIG. 16 depicts an exemplary timing diagram showing Set/Reset selection and ADC sampling timing. In the FIG. 16 depiction, an exemplary timing diagram 1600 shows the switch timing 1605 of the analog switch 1515 operation with respect to the set timing 1610 of a set operation and a reset timing 1615 of a reset operation. The switch timing 1605 represents the time when the analog switch disconnects the output of the AMR sensor from circuitry responsive to the output. Also depicted in FIG. 16 is the ADC sampling timing 1620 with respect to the set timing 1610 of the set operation and the reset timing 1615 of the reset operation. The ADC sampling time begins a time period after the completion of the set or reset operation so as to permit the circuitry to settle before performing a sampling of an AMR sensor signal. The ADC sampling completes before any subsequent set or reset operation begins so that the sampling operation is not disturbed by a transient disturbance associated with the set and reset operations.

Figure 17:
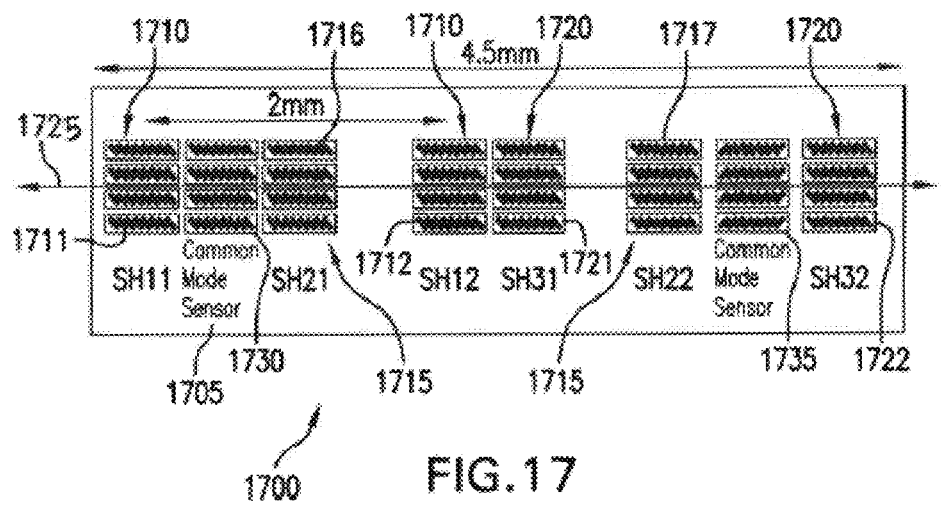
FIG. 17 depicts an exemplary silicon substrate with four gradiometers patterned along an axis.

FIG. 17 depicts an exemplary silicon substrate with three gradiometers patterned along an axis. In the depicted embodiment, an exemplary in-hole current-measurement system 1700 is depicted on a single semiconductor substrate 1705. On the substrate are three distinct gradiometers 1710, 1715, 1720. Each gradiometer has two separate AMR sensing bridges. The three gradiometers 1710, 1712, and 1714 are aligned on a common axis 1725. The leftmost gradiometer 1710 has two separately located AMR bridge sensors 1711, 1712. The center gradiometer 1715 has two separately located AMR bridge sensors 1716, 1717. The rightmost gradiometer 1720 has two separately located AMR bridge sensors 1721, 1722. The semiconductor substrate also has two additional AMR bridge sensors for measuring a common-mode magnetic field of a pair of AMR bridge sensors. The leftmost common-mode bridge sensor 1730 measures the common-mode magnetic field of AMR bridge sensors 1711 and 1715. The rightmost common-mode bridge sensor 1735 measures the common-mode magnetic field of AMR bridge sensors 1715 and 1722. The outputs of the AMR bridge sensors corresponding to each gradiometer may be connected to the input nodes of a difference amplifier. In the depicted embodiment, each gradiometers are interdigitated with its nearest neighbor gradiometer. In some embodiments, such interdigitation may advantageously permit a larger difference between the output signals of the AMR bridge sensors associated with a gradiometer.

Figure 18:
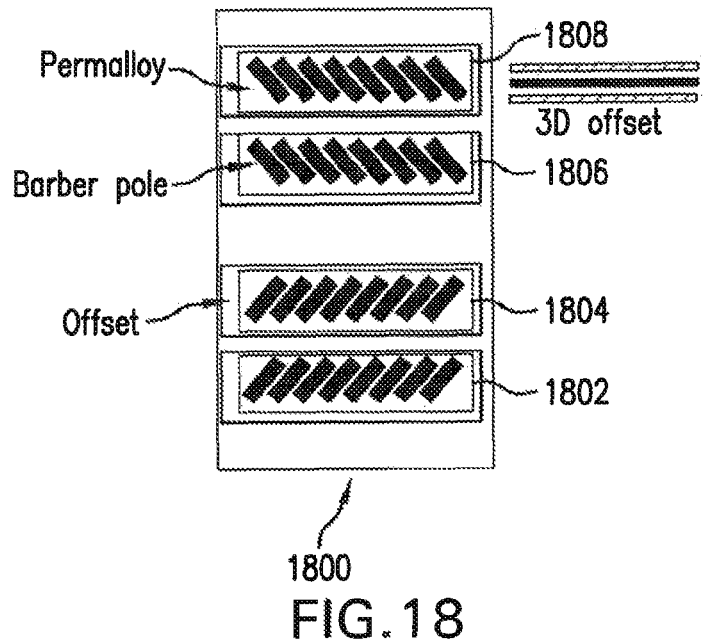
FIG. 18 depicts an exemplary AMR sensor with set/reset and offset straps.

FIG. 18 depicts an exemplary AMR sensor with set/reset and offset straps. In the FIG. 18 depiction, a single AMR bridge sensor 1800 is depicted as having four AMR bridge elements 1802, 1804, 1806, 1808. Each AMR bridge element has diagonal runners of high conductivity material. Such diagonal runners may direct the current flow in the lower conductivity AMR thin film in a direction perpendicular to the direction of the runners. In some embodiments, the easy axis is parallel the longitudinal axis of the AMR thin film. In such embodiments, the runners direct the current in the AMR thin film in a direction of approximately 45 degrees with respect to the easy axis. This may permit the AMR thin film to operate in a high sensitivity region of operation. The diagonal alignment of the runners is sometimes referred to as a 'barber pole' arrangement. The easy axis of each of the four AMR bridge elements may be aligned in the same direction as the thin film for each bridge element may have been simultaneously deposited. The deposition operation may have been performed in the presence of a strong magnetic field orienting the easy axis of the thin layer of AMR material.

Figure 19:
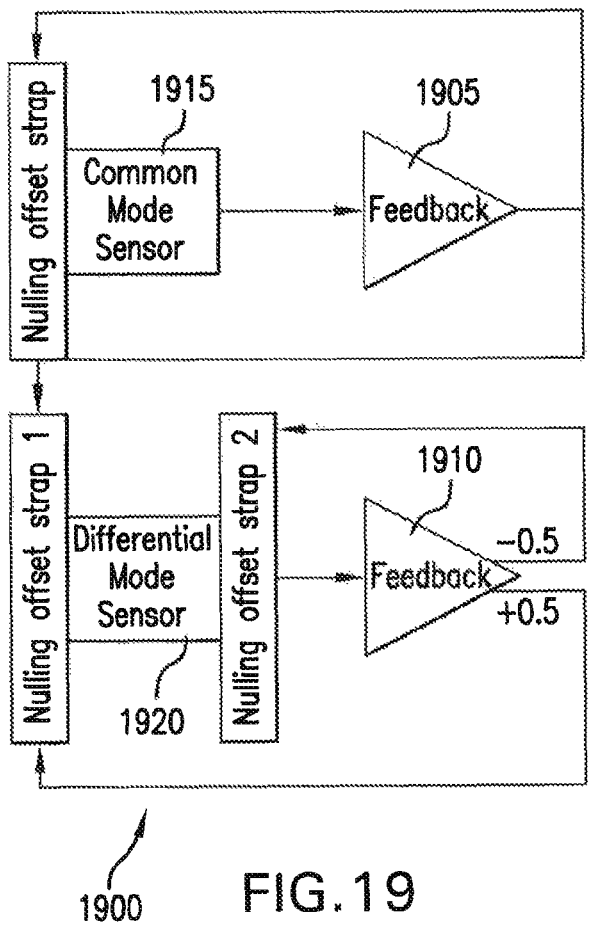
FIG. 19 depicts and exemplary block diagram of both common-mode and differential mode offset nulling.

FIG. 19 depicts and exemplary block diagram of both common-mode and differential mode offset nulling. The FIG. 19 depiction shows an exemplary block diagram 1900 including both a common-mode feedback amplifier 1905 and a differential-mode feedback operator 1910. A common-mode AMR bridge sensor 1915 may detect a common-mode magnetic field for two adjacent AMR bridge sensors. One such bridge sensor 1920 is depicted in the figure. The differential-mode feedback operator 1920 may perform the nulling operation that was described above. In this way, the output of the differential-mode operator may be indicative of the difference between the two AMR bridge sensors of a gradiometer.

Figure 20:
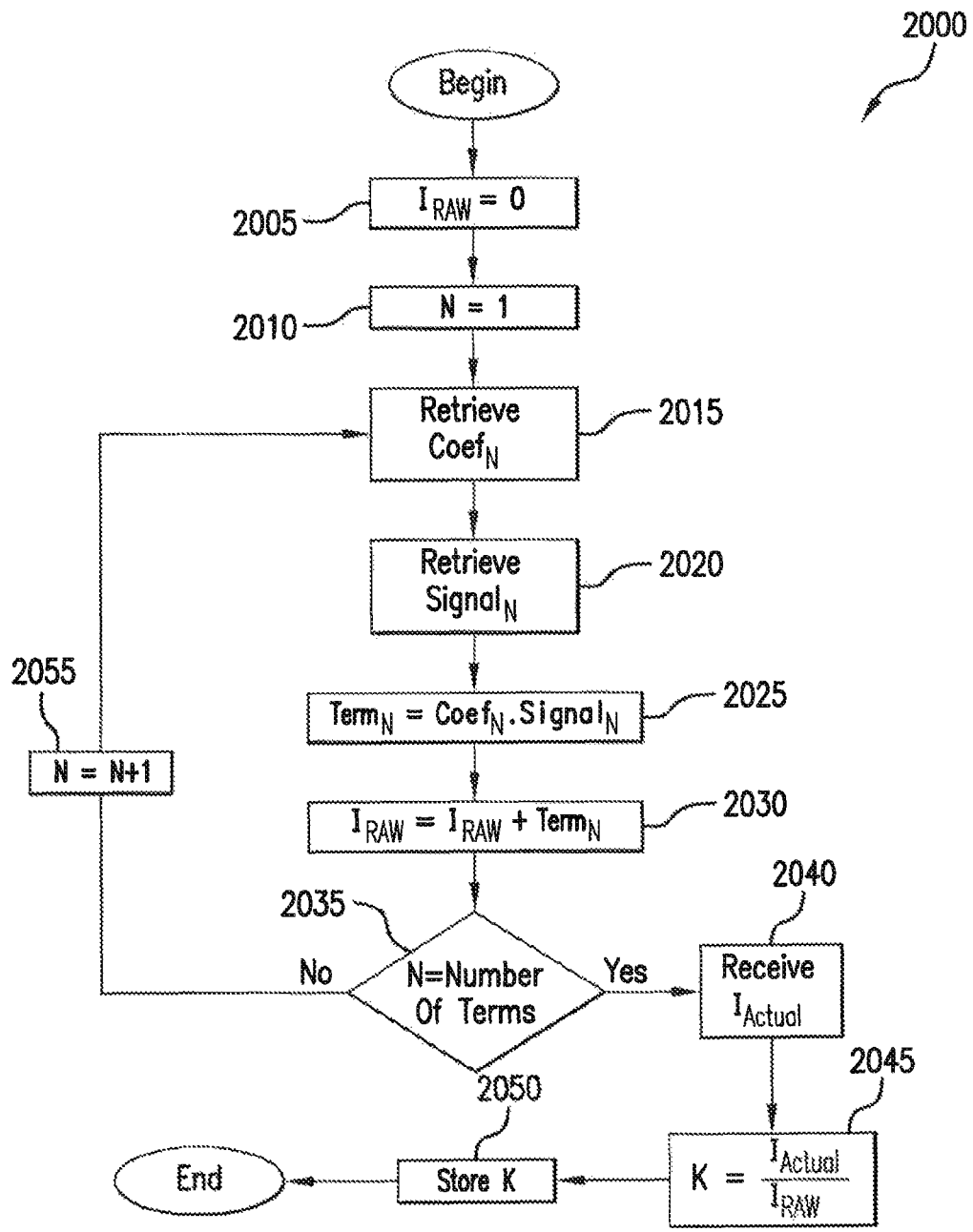
FIG. 20 depicts a flow chart of an exemplary method of calibrating an in-hole current-measurement system.

FIG. 20 depicts a flow chart of an exemplary method of calibrating an in-hole current-measurement system. In the FIG. 20 embodiment, a method 2000 of calibrating an in-hole measurement system is described. The method 2000 is depicted from the perspective of the microprocessor 1145 in FIG. 11. The exemplary method 2000 begins with the processor 1145 initializing the raw current measurement to zero 2005. Then the processor 1145 initializes the term number, N, on which the processor 1145 will calculate to 1, which represents the first term 2010. The processor 1145 then retrieves the $N^{th}$ coefficient which may have been precalculated as described above 2015. For example, the precalculated coefficients may be calculated based upon the positions of the sensors within a hold in an electrical conductor. The coordinate system selected for calculating the coefficients may be one in which the zero coordinate is located at the center of the hole as measured from a top surface of the electrical conductor to a bottom surface of the electrical conductor. In some embodiments, the zero location may be irrelevant for the precalculation. For example, if the model used is a $3^{rd}$ order Taylor series, and four sensors are used for the in-hole measurement device, the cubic term may be independent of zero coordinate location. After retrieving the $N^{th}$, the processor 1145 then receives the output signal corresponding to the $N^{th}$ magnetic-field sensor 2020. The processor 1145 then calculates the $N^{th}$ model term by determining the product of the retrieved $N^{th}$ coefficient and the $N^{th}$ sensor signal 2025. The processor 1145 then adds the calculated $N^{th}$ term to the raw current measurement sum 2030. The processor 1145 then determines if all terms have been calculated and added to the raw current measurement sum 2035. If all the terms have been calculated, the processor 1145 receives a true measurement of the electrical current flowing in the electrical conductor in which the in-hole current measurement system resides 2040. The actual measurement may be determined by precision laboratory equipment used in a calibration station, for example. The processor 1145 then calculates a calibration coefficient, K, relating the raw current measurement sum to the actual electrical current being measured 2045. The processor 1145 then stores the calibration coefficient in a data store 2050. The calibration coefficient may later be used during run-time operation of the in-hole current-measurement device. If back at step 2035, the processor 1145 determines that more model terms are still needed, the processor 1145 will increment the term count, N, 2055. Then the processor 1145 will return to step 2015.

In some embodiments, if one uses a polynomial model for the magnetic field profile along the axis of the magnetic-field sensors, only even order terms may be needed and/or used. If the electrical conductor has mirror symmetry about a plane through the center of the hole and parallel to both top and bottom surfaces of the electrical conductor, one may expect only odd order behavior of the magnetic field profile along the sensor axis. An odd-term-only model may be one such as given here:

$$z = dx^3 + bx$$

Setting up the regression matrix for determining the coefficient relationship to sensor measurement may be given below:

$$\begin{bmatrix} -1.5\Delta & -3.375\Delta^3 \\ -0.5\Delta & -0.125\Delta^3 \\ 0.5\Delta & 0.125\Delta^3 \\ 1.5\Delta & 3.375\Delta^3 \end{bmatrix} \begin{bmatrix} b \\ d \end{bmatrix} = \begin{bmatrix} z_1 \\ z_2 \\ z_3 \\ z_4 \end{bmatrix}$$

Then the regression can again be performed as follows:

$$\begin{bmatrix} b \\ d \end{bmatrix} = (A^T A)^{-1} A^T \begin{bmatrix} z_1 \\ z_2 \\ z_3 \\ z_4 \end{bmatrix}$$

The d coefficient here again represents the cubic coefficient. Here $A^T$ again represents the transpose of the A matrix. For the above example, the both the b and the d coefficients are found, the d coefficient obtained is related to the sensor measurements exactly as it was using both even and odd model terms as described above:

$$b = 0.042 z_1 - 1.125 z_5 + 1.125 z_3 - 0.042 z_4$$

$$d = -0.083 z_1 + 0.167 z_2 - 0.167 z_3 + 0.083 z_4$$

Figure 21:
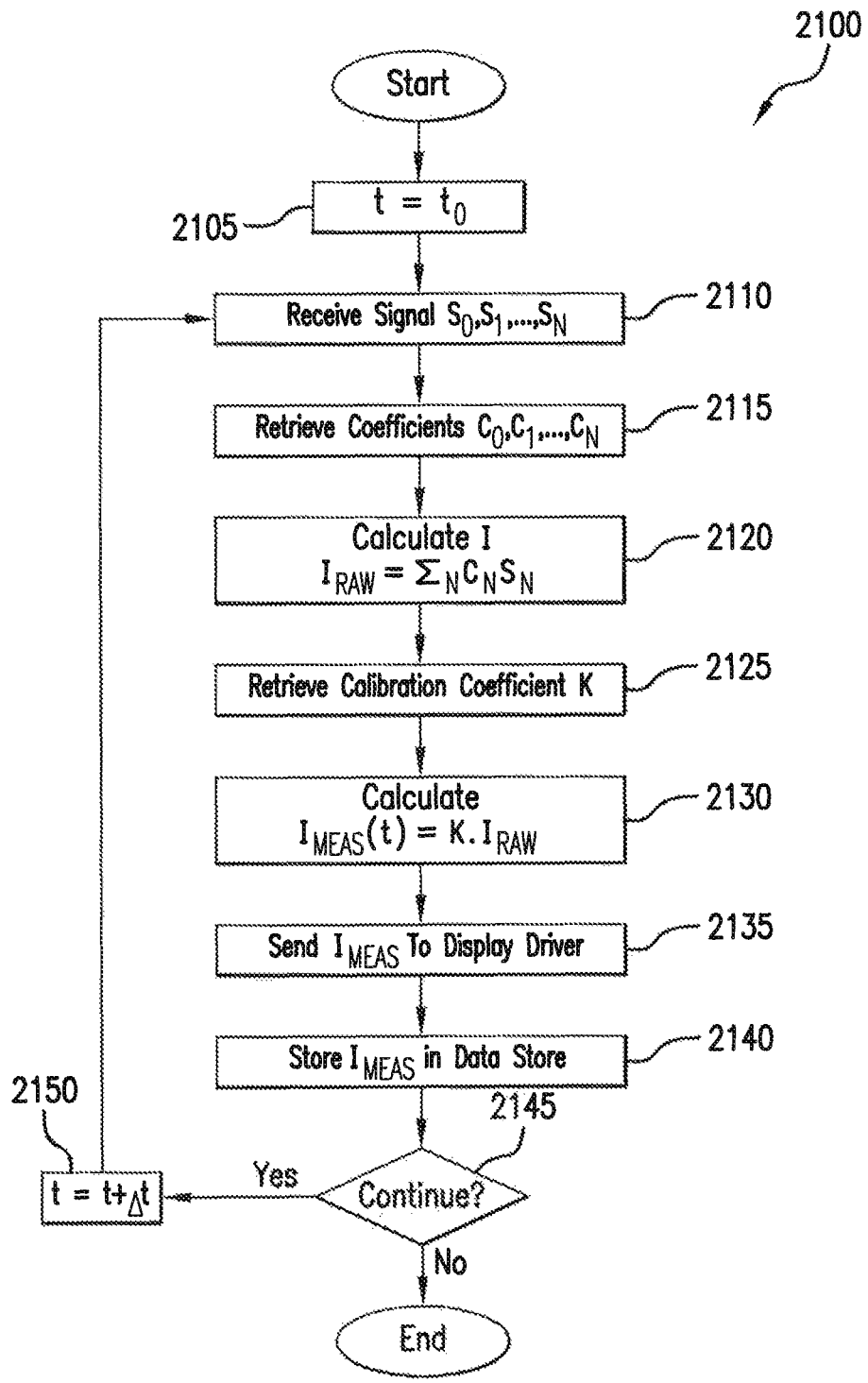
FIG. 21 depicts a flow chart of an exemplary method of measuring current in a conductor using an in-hole current-measurement device.

FIG. 21 depicts a flow chart of an exemplary method of measuring current in a conductor using an in-hole current-measurement device. In the FIG. 21 embodiment, a method 2100 of performing run-time current measurements using an in-hole measurement system is described. The method 2100 is depicted from the perspective of the microprocessor 1145 in FIG. 11. The processor 1145 begins the exemplary method by initializing the time of the first measurement 2105. Then the processor 1145 receives the signals from the outputs of the N magnetic-field sensors 2110. The processor 1145 then retrieves the coefficients corresponding the N magnetic-field sensors 2115. These coefficients may have been predetermined as described above, for example. The processor 1145 then calculates the raw current measurement by summing the products of the respective coefficients and sensors output values 2120. The processor 1145 then retrieves the calibration coefficient from memory 2125. The calibration coefficient may be temperature dependent. In some embodiments, the calibration coefficient may be temperature independent. For example, the calibration coefficient may be determined by a method as above with reference to FIG. 20. The processor 1145 then calculates the measured electrical current by multiplying the retrieved calibration coefficient by the calculated raw current measurement 2130. Then the processor 1145 sends the calculated measured electrical current to a display driver for display on a display device 2135. The processor 1145 then stores the measured current along with a time stamp in a data store 2140. The processor 1145 then determines if more current measurements need to be obtained 2145. If more current measurements are needed, the processor 1145 updates the time stamp for the upcoming measurement 2150, and returns to the 2110 operation. If no more current measurements are needed, the method terminates.

Figure 22:
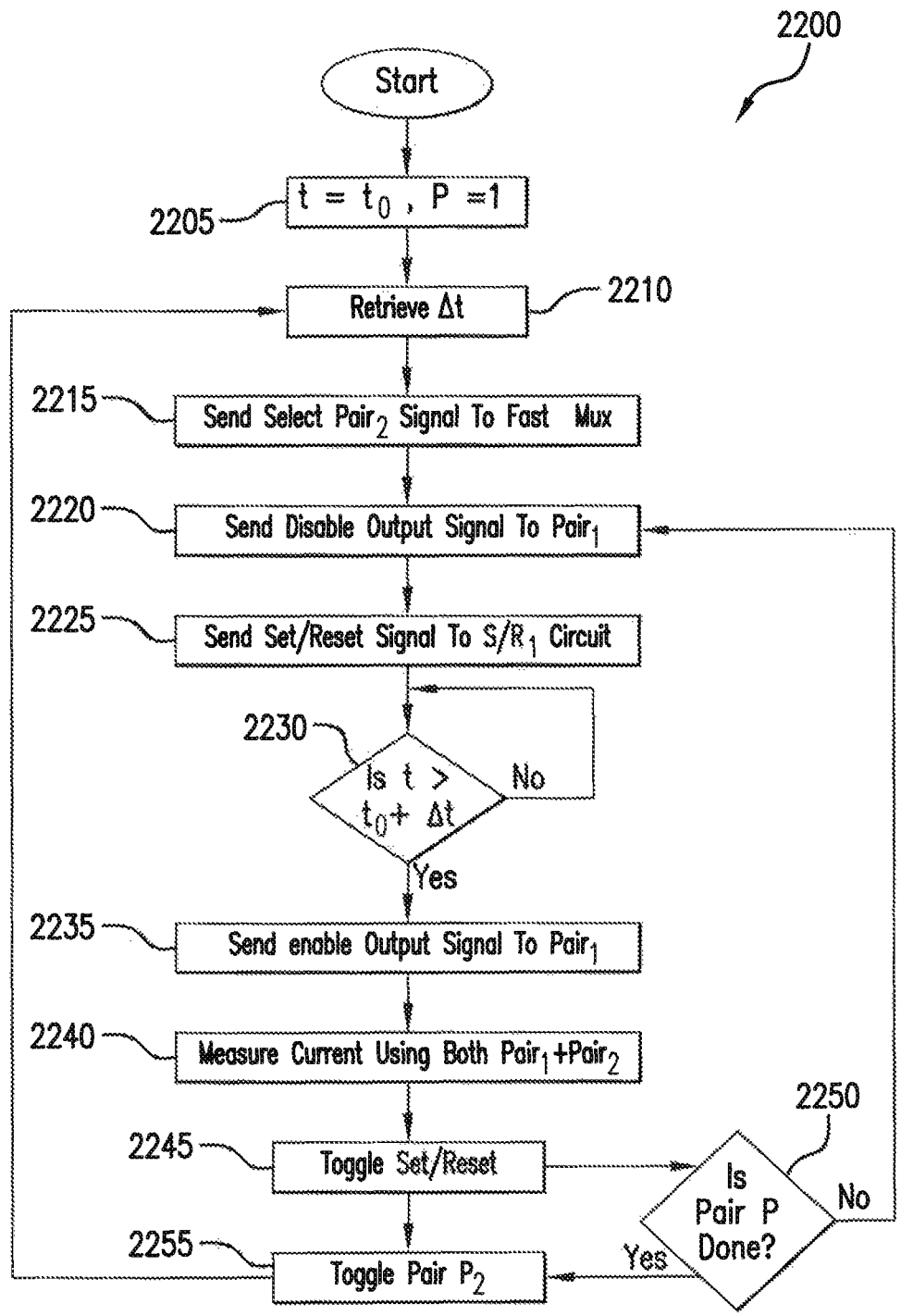
FIG. 22 depicts a flow chart of an exemplary method of performing set/reset operation while providing continuous current-measurement signals.

FIG. 22 depicts a flow chart of an exemplary method of performing set/reset operation while providing continuous current-measurement signals. In the FIG. 22 embodiment, a method 2200 is described for performing set/reset operations on a pair of AMR sensors while simultaneously using the outputs of another pair of AMR sensors for continuous current measurement. The method 2200 is depicted from the perspective of the microprocessor 1145 in FIG. 11. The method begins with the processor 1145 initializing both the time stamp and the pair of AMR sensors to which a set/reset operation will be performed 2205. The processor 1145 then will retrieve the delta time window length during which the pair of AMR sensors will be disabled 2210. The processor 1145 then sends a signal to the fast analog multiplexor to select the pair of sensors that will not be disturbed by the set/reset operation 2215. The selected pair may then provide continuous current measurements during the set/reset operation of the other pair. The processor 1145 then sends a signal to disable the outputs of the sensors to which the set/reset operation will be performed 2220. By disabling the sensor outputs, the circuitry that normally receives those outputs may not be disturbed by the set/reset operation. The processor 1145 then sends a command for the set/reset module to perform a set or reset operation on the pair of sensors requiring the operation 2225. The processor 1145 then determines if the time window for disturbance has passed 2230. If the predetermined time window for disturbance has not completed or passed, the processor remains at this step and waits for the disturbance to settle. If, however, the time window has passed, the processor 1145 then sends a signal to again enable the output of the sensors upon which the set or reset operation has been performed 2235. The processor 1145 then performs the run-time measurement of current using all four sensors of the two pairs of sensors 2240. Such an operation may be like the one described in the runtime method 2100 with reference to FIG. 21, for example. The processor 1145 then toggles the set/reset parameter so that if the previous operation was a set operation, the upcoming operation will be a reset operation, and vice versa 2245. The processor 1145 then determines if the sensor has completed both the set operation and the reset operation 2250. If the sensor has yet to have both the set and the reset operation performed upon it, the processor 1145 returns to step 2220. If, however, the sensor has had both the set and the reset operations performed, the processor 1145 toggles the pair of sensors that will receive the next set or reset operation 2255. In this way, alternating pairs of sensors may be selected for performing the continuous current measurement while the other pair is receiving a set/reset operation.

In some embodiments, the output signals of the magnetic-field sensors received, for example, by the processor 1145 in the above described exemplary methods 2000, 2100, and 2200, may be a signal representative of a magnetic field strength and/or polarity. In some embodiments, the output signals of the magnetic-field sensors may represent a gradient of a magnetic field. For example, some exemplary magnetic-field sensors may have a pair of field sensing devices space apart. The output of some such magnetic-field sensors may represent the difference between each of the pair of field sensing devices, for example.

Although various embodiments have been described with reference to the Figures, other embodiments are possible. For example, various hole shapes may be used. Each hole shape may result in a different functional relationship between hole position and magnetic field measurement. In some embodiments, a cavity may be used which may be a hole that doesn't completely go through the conductor. In some embodiments a square hole may be used. In some embodiments, the sensor array may be located intentionally off-center within the hole, either in the hole-direction or the lateral transverse direction or both. In some embodiments, the number of sensors may be more than four. For example in an exemplary embodiment sixteen magnetic field sensors may be used. In some embodiments the sensors may be manufactured all on one silicon die. In some embodiments each sensor may be discrete. The sensors may be mounted on a circuit board. In various embodiments a microcontroller may perform the signal processing. In some embodiments, the signal processing may be performed using analog circuitry. Some embodiments may include a centering fixture which may center the sensor array within a hole.

Other embodiments may include a temperature sensor located near the current sensors. The temperature sensor may be used compensate for temperature sensitivities of the current sensors. In some embodiments, variations in feedback current may cause temperature increases. The calculations and equations shown above may be performed fully with an arithmetic unit, for example, or aided with lookup tables. Some embodiments may include a calibration feature. If, for example, the sensor output is dependent on the exact dimensions of the current conductor in the vicinity of the hole, then those dimensions could be measured with caliper by the user and entered in a signal processor interface. A signal processor may calculate the correct output of the sensor based on these entered values, for example.

Various exemplary embodiments may include two subsets of sensors for providing substantially continuous current measurement while simultaneously permitting periodic disturbance producing operations on a single subset of sensors. For example, an exemplary current-measurement system may have two subsets, each subset including two magnetic-field sensors. Subsets containing three, four, or any reasonable number of sensors may be possible. In some embodiments, subsets may be mutually exclusive of each other. In some embodiments, subsets may be overlapping. For example, a current-measurement system may include six sensors divided into three overlapping groups of four sensors each. For example, a disturbance producing operation may be performed on two sensors while the complementary group of four sensors provides precise current measurement. In another example, five sensors may be divided into five overlapping groups of four sensors. The above described coefficient determination may then determine the appropriate coefficients for use by each subset of sensors. In an exemplary embodiment, a current-measurement system may include two mutually exclusive subsets of four sensors each. Each group may be interdigitated with the other group, for example. Sensor groups with a large number of sensors (e.g. four or more) may advantageously precisely measure current even during a transient disturbance event affecting a complementary subset of sensors.

Some aspects of embodiments may be implemented as a computer system. For example, various implementations may include digital and/or analog circuitry, computer hardware, other sensors (e.g. temperature sensors), firmware, software, or combinations thereof. Apparatus elements can be implemented in a computer program product tangibly embodied in an information carrier, e.g., in a machine-readable storage device, for execution by a programmable processor; and methods can be performed by a programmable processor executing a program of instructions to perform functions of various embodiments by operating on input data and generating an output. Some embodiments can be implemented advantageously in one or more computer programs that are executable on a programmable system including at least one programmable processor coupled to receive data and instructions from, and to transmit data and instructions to, a data storage system, at least one input device, and/or at least one output device. A computer program is a set of instructions that can be used, directly or indirectly, in a computer to perform a certain activity or bring about a certain result. A computer program can be written in any form of programming language, including compiled or interpreted languages, and it can be deployed in any form, including as a stand-alone program or as a module, component, subroutine, or other unit suitable for use in a computing environment.

Suitable processors for the execution of a program of instructions include, by way of example and not limitation, both general and special purpose microprocessors, which may include a single processor or one of multiple processors of any kind of computer. Generally, a processor will receive instructions and data from a read-only memory or a random access memory or both. The essential elements of a computer are a processor for executing instructions and one or more memories for storing instructions and data. Storage devices suitable for tangibly embodying computer program instructions and data include all forms of non-volatile memory, including, by way of example, semiconductor memory devices, such as EPROM, EEPROM, and flash memory devices; magnetic disks, such as internal hard disks and removable disks; magneto-optical disks; and, CD-ROM and DVD-ROM disks. The processor and the memory can be supplemented by, or incorporated in, ASICs (application-specific integrated circuits). In some embodiments, the processor and the member can be supplemented by, or incorporated in hardware programmable devices, such as FPGAs, for example.

In some implementations, each system may be programmed with the same or similar information and/or initialized with substantially identical information stored in volatile and/or non-volatile memory. For example, one data interface may be configured to perform auto configuration, auto download, and/or auto update functions when coupled to an appropriate host device, such as a desktop computer or a server.

In some implementations, one or more user-interface features may be custom configured to perform specific functions. An exemplary embodiment may be implemented in a computer system that includes a graphical user interface and/or an Internet browser. To provide for interaction with a user, some implementations may be implemented on a computer having a display device, such as an LCD (liquid crystal display) monitor for displaying information to the user, a keyboard, and a pointing device, such as a mouse or a trackball by which the user can provide input to the computer.

In various implementations, the system may communicate using suitable communication methods, equipment, and techniques. For example, the system may communicate with compatible devices (e.g., devices capable of transferring data to and/or from the system) using point-to-point communication in which a message is transported directly from the source to the receiver over a dedicated physical link (e.g., fiber optic link, point-to-point wiring, daisy-chain). The components of the system may exchange information by any form or medium of analog or digital data communication, including packet-based messages on a communication network. Examples of communication networks include, e.g., a LAN (local area network), a WAN (wide area network), MAN (metropolitan area network), wireless and/or optical networks, and the computers and networks forming the Internet. Other implementations may transport messages by broadcasting to all or substantially all devices that are coupled together by a communication network, for example, by using omni-directional radio frequency (RF) signals. Still other implementations may transport messages characterized by high directivity, such as RF signals transmitted using directional (i.e., narrow beam) antennas or infrared signals that may optionally be used with focusing optics. Still other implementations are possible using appropriate interfaces and protocols such as, by way of example and not intended to be limiting, USB 2.0, Firewire, ATA/IDE, RS-232, RS-422, RS-485, 802.11 a/b/g/n, Wi-Fi, Ethernet, IrDA, FDDI (fiber distributed data interface), token-ring networks, or multiplexing techniques based on frequency, time, or code division. Some implementations may optionally incorporate features such as error checking and correction (ECC) for data integrity, or security measures, such as encryption (e.g., WEP) and password protection.

A number of implementations have been described. Nevertheless, it will be understood that various modification may be made. For example, advantageous results may be achieved if the steps of the disclosed techniques were performed in a different sequence, or if components of the disclosed systems were combined in a different manner, or if the components were supplemented with other components. Accordingly, other implementations are contemplated or within the scope of the following claims.

What is claimed is:

1. An in-hole sampled current-measurement system with uninterrupted short-circuit/overcurrent detection, system comprising:

three or more magnetic-field sensors configured to be inserted into a hole in an electrical conductor, each sensor operative to generate a signal at an output in response to a magnetic-field strength at the sensor's location;

a selection module coupled to each of the sensors' outputs to receive each of the sensors' respective signals representative of the magnetic-field strength at each of the sensors' respective locations;

a control module operative to control the selection module to select a subset of the magnetic-field sensors at a scheduled time of a predetermined disturbance event, and to cause a set of the non-selected magnetic-field sensors, which are scheduled to receive a disturbance associated with the predetermined disturbance event, to be deselected at the scheduled time of the predetermined disturbance event;

a continuous-measurement module coupled to the selection module to process the signals associated with the selected subset of the magnetic-field sensors to generate a continuous output signal representative of an electrical current in the electrical conductor; and a periodic-measurement module coupled to each of the three or more magnetic-field sensors' outputs to receive each of the three or more sensors' respective signals representative of the magnetic-field strength at each of the three or more sensors' respective locations, and operative to process the received three or more magnetic-field sensors' outputs to generate a periodic output signal representative of the electrical current in the electrical conductor.

2. The in-hole current-measurement system of claim 1, further comprising a short circuit detector that generates an alarm signal if the continuous output signal exceeds a predetermined current threshold.

3. The in-hole sampled current-measurement system of claim 1, wherein a set of three or more of the magnetic-field sensors are aligned on an axis configured to be mounted with at least a component of the aligned axis perpendicular to a direction of the electrical-current in the conductor when inserted into the hole in the electrical conductor.

4. The in-hole sampled current-measurement system of claim 2, wherein each of the three or more magnetic-field sensors have a direction of magnetic sensitivity aligned perpendicular to both the aligned axis and the direction of electrical-current flow when inserted into the hole in the electrical conductor.

5. The in-hole sampled current-measurement system of claim 1, wherein each of the three or more magnetic-field sensors comprises an Anisotropic Magneto-Resistive (AMR) sensor having a thin film of Permalloy, and further comprising an AMR Set/Reset (SR) module for aligning the magnetic domains of the thin film of Permalloy parallel to an easy axis, wherein an expected disturbance signal comprises either a Set pulse or a Reset pulse for aligning the magnetic domains of the thin film of Permalloy parallel to an easy axis of an AMR sensor.

6. An in-hole current-measurement system with uninterrupted short-circuit/overcurrent detection, system comprising:
three or more magnetic-field sensors configured to be inserted into a hole in an electrical conductor, each sensor operative to generate a signal at an output in response to a magnetic-field strength at the sensor's location;
a selection module coupled to each of the sensors' outputs to receive each of the sensors' respective signals representative of the magnetic-field strength at the sensor's location;
a control module operative to control the selection module to select a subset of the magnetic-field sensors at a scheduled time of a predetermined disturbance event, and to cause a set of the non-selected magnetic-field sensors, which are scheduled to receive a disturbance associated with the predetermined disturbance event, to be deselected at the scheduled time of the predetermined disturbance event;
a continuous-measurement module coupled to the selection module to process the signals associated with the selected subset of the magnetic-field sensors to generate a continuous output signal representative of an electrical current in the electrical conductor; and
a periodic-measurement module coupled to each of the three or more magnetic-field sensors' outputs to receive each of the three or more sensors' respective signals representative of the magnetic-field strength at each of the three or more sensors' respective locations, and operative to process the received three or more magnetic-field sensors' outputs to generate a periodic output signal representative of the electrical current in the electrical conductor;
wherein outputs of a first and second magnetic-field sensor are connected to a first amplifier;
wherein outputs of the second and a third magnetic-field sensor are connected to a second amplifier;
wherein outputs of the third and a fourth magnetic-field sensor are connected to a third amplifier;
wherein the first and third amplifier are connected to mutually exclusive pairs of magnetic-field sensors.

7. The in-hole current-measurement system of claim 6, further comprising a short circuit detector that generates an alarm signal if the continuous output signal exceeds a predetermined current threshold.

8. The in-hole current-measurement system of claim 6, wherein the selected subset of sensor signals consists of two sensor signals and the generated continuous output signal is based upon a difference between the two signals of the two sensors of the selected subset.

9. The in-hole current-measurement system of claim 6, wherein a set of three or more of the magnetic-field sensors are aligned on an axis configured to be mounted with at least a component of the aligned axis perpendicular to a direction of electrical-current flow of the conductor when inserted into the hole in the electrical conductor.

10. The in-hole current-measurement system of claim 9, wherein each of the three or more the magnetic-field sensors have a direction of sensitivity aligned perpendicular to both the aligned axis and the direction of electrical-current flow when inserted into the hole in the electrical conductor.

11. The in-hole current-measurement system of claim 6, wherein each of the three or more magnetic-field sensors comprises an Anisotropic Magneto-Resistive (AMR) sensor.

12. The in-hole current-measurement system of claim 11, wherein each of the AMR sensors comprise a thin film of Permalloy.

13. The in-hole current-measurement system of claim 12, wherein the predetermined disturbance event comprises either a Set pulse or a Reset pulse for aligning the magnetic domains of the thin film of Permalloy parallel to an easy axis of an AMR sensor.

14. A method of measuring current in a conductor, the method comprising:
receiving signals from outputs of N magnetic-field sensors;
retrieving coefficients corresponding to the N magnetic-field sensors;
summing products of the coefficients and the sensors output values to calculate a raw current measurement;
retrieving a calibration coefficient from a memory;
multiplying the retrieved calibration coefficient by the calculated raw current measurement to calculate a measured electrical current;
initializing both a time stamp and a first pair of AMR sensors of the N magnetic-field sensors;
retrieving a delta time window length during which the first pair of AMR sensors will be disabled during a set/reset operation;
sending a first signal to a fast analog multiplexor to select a second pair of AMR sensors of the N magnetic-field sensors that will not be disturbed by the set/reset operation;

disabling outputs of the first pair of AMR sensors;
sending a command for a set/reset module to perform a set operation or a rest operation on the first pair of AMR sensors;
determining the time window for disturbance has passed;
enabling the outputs of the first pair of AMR sensors when the time window for the disturbance has passed; and
performing the method of measuring the current in the conductor using all sensors of the first pair of AMR sensors and the second pair of AMR sensors.

15. The method of claim 14, further comprising:
sending the calculated measured electrical current to a display driver;
displaying the calculated measured electrical current on a display device in response to the sending; and
storing the measured current along with a time stamp in a data store.

16. The method of claim 14, wherein the calibration coefficient is temperature dependent.

17. The method of claim 16, further comprising:
performing the method of measuring the current in the conductor using the second pair of AMR sensors while the outputs of the first pair of AMR sensors are disabled.

* * * * *